United States Patent
Horiuchi et al.

(10) Patent No.: US 10,621,941 B2
(45) Date of Patent: Apr. 14, 2020

(54) DISPLAY DEVICE

(71) Applicant: Sharp Kabushiki Kaisha, Sakai, Osaka (JP)

(72) Inventors: Satoshi Horiuchi, Sakai (JP); Seijirou Gyouten, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 0 days.

(21) Appl. No.: 16/391,349

(22) Filed: Apr. 23, 2019

(65) Prior Publication Data

US 2019/0333464 A1 Oct. 31, 2019

(30) Foreign Application Priority Data

Apr. 26, 2018 (JP) ................. 2018-084950

(51) Int. Cl.
| | |
|---|---|
| G09G 3/36 | (2006.01) |
| G02F 1/1362 | (2006.01) |
| G02F 1/1368 | (2006.01) |
| H01L 27/12 | (2006.01) |

(52) U.S. Cl.
CPC ......... *G09G 3/3677* (2013.01); *G02F 1/1368* (2013.01); *G02F 1/136286* (2013.01); *H01L 27/124* (2013.01); *H01L 27/1225* (2013.01); *G09G 2300/0426* (2013.01); *G09G 2300/0439* (2013.01); *G09G 2310/0286* (2013.01); *G09G 2310/08* (2013.01)

(58) Field of Classification Search
CPC ......... G09G 3/3677; G09G 2300/0439; G09G 2310/0286; G09G 2310/08; G09G 2300/0426; G09G 3/3611; G09G 2310/0281; G02F 1/136286; G02F 1/1368; H01L 27/1225; H01L 27/124
See application file for complete search history.

(56) References Cited

U.S. PATENT DOCUMENTS

| | | | |
|---|---|---|---|
| 8,462,098 B2* | 6/2013 | Tobita ............. | G09G 3/3677 345/100 |
| 9,336,897 B2* | 5/2016 | Tobita ............. | G11C 19/184 |
| 2010/0245312 A1 | 9/2010 | Yamazaki | |
| 2014/0092082 A1 | 4/2014 | Choi | |

FOREIGN PATENT DOCUMENTS

| | | |
|---|---|---|
| JP | 2010-224438 A | 10/2010 |
| JP | 2014-71451 A | 4/2014 |

* cited by examiner

*Primary Examiner* — Bryan Earles
(74) *Attorney, Agent, or Firm* — Keating & Bennett, LLP

(57) ABSTRACT

A display device has a display panel including gate lines, a driving circuit, and an auxiliary circuit corresponding to each gate lines. To the driving circuit and the auxiliary circuit, one driving signal of M-phase driving signals (M≥4) having selection potential and non-selection potential, is supplied. The driving circuit outputs the driving signal to a corresponding gate line. A selection period for the gate line includes a pre-charging period and a main charging period, and the main charging period overlaps with the pre-charging period for the adjacent gate line. The auxiliary circuit is driven during the main charging period for the corresponding gate line and during the main charging period for the next gate line. The auxiliary circuit outputs the selection potential during the main charging period for the corresponding gate line, and outputs the non-selection potential during the main charging period for the next gate line.

10 Claims, 14 Drawing Sheets

DISPLAY DEVICE

TECHNICAL FIELD

The present invention relates to a display device.

BACKGROUND ART

Conventionally, a variety of techniques relating to shift registers for scanning gate lines in a display panel have been proposed.

For example, Japanese patent publication No. 2014-71451 (hereinafter referred to as JP 2014-71451 A) discloses a liquid crystal display device in which a gate driving unit for switching each of the odd-number-th gate lines to a selected state, and a gate driving unit for switching each of the even-number-th gate line to a selected state, are provided in right and left frame regions, which are on both sides of ends of gate lines, respectively. In this liquid crystal display device, a discharge circuit for switching each of the odd-number-th gate lines to a non-selected state, and a discharge circuit for switching each of the even-number-th gate lines to a non-selected state, are arranged in the right and left frame regions, respectively. In this liquid crystal display device, in order to allow stable pixel charging to be performed during the data voltage application, a pre-charging period is provided; in the pre-charging period, a period while a gate driving voltage applied to a gate line is a gate high voltage overlaps with an identical period for another gate line adjacent thereto.

Each discharge circuit in JP 2014-71451 A includes a gate electrode that is connected with a driving unit that outputs a gate high voltage at the end of the gate line selection period, a first electrode that is connected with the gate line, and a second electrode to which a gate low voltage VGL is supplied. The discharge circuit is driven at the end of the selection period in which the gate line corresponding thereto is selected, outputs the gate low voltage VGL to the corresponding gate line, and switches the gate line to a non-selected state.

SUMMARY OF THE INVENTION

In a case where the discharge circuit is driven at a timing when the gate line selection period ends as is the case with JP 2014-71451 A described above, if the driving of the discharge circuit delays, the gate line cannot be switched to a non-selected state after the end of the gate line selection period, resulting in that display defects are caused.

It is an object of the present invention to provide a technique that allows the transition of a gate line to a non-selected state to be carried out quickly and surely.

A display device in one embodiment of the present invention includes: a display panel having a plurality of gate lines; a plurality of driving circuits that are provided so as to correspond to the gate lines, respectively, the driving circuits sequentially switching the gate lines to a selected state so as to scan the gate lines sequentially; a plurality of auxiliary circuits that are provided so as to correspond to the gate lines, respectively, the auxiliary circuits being connected with the corresponding gate lines, respectively; and a control circuit that supplies, to the driving circuits and the auxiliary circuits, control signals that include M-phase driving signals (M is a natural number of 4 or greater), wherein each of the M-phase driving signals makes a transition in a predetermined cycle between a first potential level corresponding to a gate line selected state, and a second potential level corresponding to a gate line non-selected state, to each of the driving circuits and the auxiliary circuits, one driving signal of the M-phase driving signals is supplied, each of the driving circuits outputs a potential of the supplied one driving signal to the gate line as a scanning object so as to switch the gate line as a scanning object to the selected state or the non-selected state, a selection period in which the gate line is in the selected state includes a pre-charging period and a main charging period, the main charging period for one of adjacent two of the gate lines and the pre-charging period for the other one of the adjacent two of the gate lines overlapping with each other, and each of the auxiliary circuits is driven at least during the main charging period for the gate line corresponding to the said auxiliary circuit, and during the main charging period for the gate line of the next stage with respect to the corresponding gate line, outputs a potential at the first potential level of the supplied one driving signal during the main charging period for the corresponding gate line, and outputs a potential at the second potential level of the supplied one driving signal during the main charging period for the gate line of the next stage.

With the present invention, the transition of a gate line to a non-selected state can be carried out quickly and surely.

MODE FOR CARRYING OUT THE INVENTION

Figure 1:
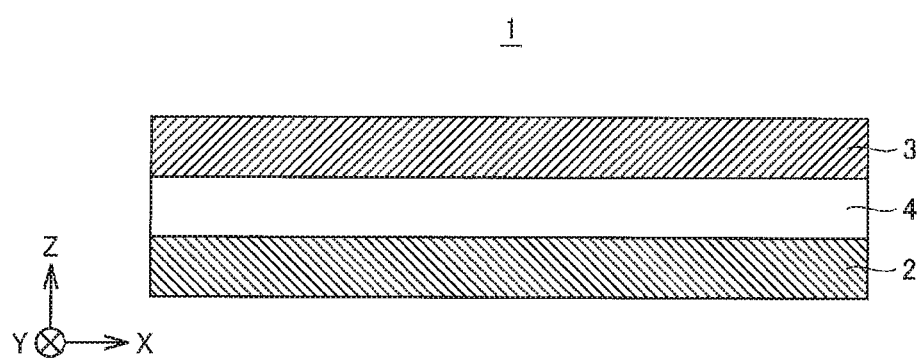
FIG. 1 is a schematic cross-sectional view of a display device in Embodiment 1.

A display device in one embodiment of the present invention includes: a display panel having a plurality of gate lines; a plurality of driving circuits that are provided so as to correspond to the gate lines, respectively, the driving circuits sequentially switching the gate lines to a selected state so as to scan the gate lines sequentially; a plurality of auxiliary circuits that are provided so as to correspond to the gate lines, respectively, the auxiliary circuits being connected with the corresponding gate lines, respectively; and a control circuit that supplies, to the driving circuits and the auxiliary circuits, control signals that include M-phase driving signals (M is a natural number of 4 or greater), wherein each of the M-phase driving signals makes a transition in a predetermined cycle between a first potential level corresponding to a gate line selected state, and a second potential level corresponding to a gate line non-selected state, to each of the driving circuits and the auxiliary circuits, one driving signal of the M-phase driving signals is supplied, each of the driving circuits outputs a potential of the supplied one driving signal to the gate line as a scanning object so as to switch the gate line as a scanning object to the selected state or the non-selected state, a selection period in which the gate line is in the selected state includes a pre-charging period and a main charging period, the main charging period for one of adjacent two of the gate lines and the pre-charging period for the other one of the adjacent two of the gate lines overlapping with each other, and each of the auxiliary circuits is driven at least during the main charging period for the gate line corresponding to the said auxiliary circuit, and during the main charging period for the gate line of the next stage with respect to the corresponding gate line, outputs a potential at the first potential level of the supplied one driving signal during the main charging period for the corresponding gate line, and outputs a potential at the second potential level of the supplied one driving signal during the main charging period for the gate line of the next stage (the first configuration).

According to the first configuration, a display device includes a plurality of driving circuits that sequentially scan a plurality of gate lines; a plurality of auxiliary circuits that are provided so as to correspond to the gate lines, respectively; and a control circuit that supplies control signals to the driving circuits and the auxiliary circuits. The control signals include driving signals of four or more phases that are different from one another. The potential of the driving signal changes in a predetermined cycle between a first potential level corresponding to a gate line selected state, and a second potential level corresponding to a gate line non-selected state. To each of the driving circuits and the auxiliary circuits, one driving signal of the M-phase driving signals is supplied. The driving circuit outputs a potential of the supplied driving signal so as to switch the gate line to the selected state or the non-selected state. A selection period in which the gate line is in the selected state includes a pre-charging period and a main charging period, and the main charging period for one of adjacent two of the gate lines and the pre-charging period for the other one of the adjacent two of the gate lines overlap with each other. The auxiliary circuit is driven during the main charging period for the corresponding gate line, and during the main charging period for the gate line of the next stage with respect to the corresponding gate line, outputs a potential at the first potential level of the supplied driving signal to the corresponding gate line during the main charging period for the corresponding gate line, and outputs a potential at the second potential level of the supplied driving signal to the corresponding gate line during the main charging period for the gate line of the next stage. Since the auxiliary circuit is driven during the main charging period for the corresponding gate line and the main charging period for the gate line of the next stage, the corresponding gate line can be switched to the non-selected state quickly and surely when the main charging period for the corresponding gate line ends.

The first configuration may be further characterized in that each of the auxiliary circuits includes a discharge switching element; each of the discharge switching elements of the auxiliary circuits corresponding to the gate lines other than the gate line of the last stage, among the auxiliary circuits, has a gate electrode connected with the gate line of the next stage; and the discharge switching element of the auxiliary circuit corresponding to the gate line of the last stage has a gate electrode that is kept at the first potential level during the main charging period for the gate line of the last stage, and during a certain period after the main charging period ends (the second configuration).

According to the second configuration, each gate line other than the gate line of the last stage is caused to have a potential at the second potential level during the selection period for the gate line of the next stage, by the discharge switching element of the auxiliary circuit corresponding to the foregoing gate line. Further, the gate line of the last stage is caused to have a potential at the second potential level, by the discharge switching element of the corresponding auxiliary circuit, during the main charging period for the gate line of the last stage, and during a certain period after the main charging period ends.

The second configuration may be further characterized in that the control signal includes a reset signal that is at the first potential level during the main charging period for the gate line of the last stage, and during a certain period after the said main charging period ends, and is at the second potential level during the other period, and the reset signal is supplied to the gate electrode of the discharge switching element of the auxiliary circuit corresponding the gate line of the last stage (the third configuration).

According to the third configuration, the reset signal is supplied to the gate electrode of the discharge switching element of the auxiliary circuit corresponding the gate line of the last stage, and the potential at the first potential level is supplied thereto during the main charging period for the gate line of the last stage, and during a certain period after the foregoing main charging period ends. This therefore makes it possible to drive the auxiliary circuit corresponding to the gate line last stage to be driven during the main charging period for the gate line of the last stage, and during a certain period after the foregoing main charging period ends.

The second configuration may be further characterized in further including: a dummy driving circuit to which one driving signal among the M-phase driving signals is supplied, which is driven during the main charging period for the gate line of the last stage, and during one horizontal scanning period after the said main charging period ends based on the one driving signal, and which outputs the potential at the first potential level of the one driving signal, to the gate electrode of the discharge switching element of the auxiliary circuit corresponding the gate line of the last stage (the fourth configuration).

According to the fourth configuration, one driving signal is supplied to the gate electrode of the discharge switching element of the auxiliary circuit corresponding the gate line of the last stage, and the potential at the first potential level is supplied during the main charging period for the gate line of the last stage, and during a certain period after the said main charging period ends. This therefore makes it possible to drive the auxiliary circuit corresponding to the gate line of the last stage to be driven during the main charging period for the gate line of the last stage, and during a certain period after the said main charging period ends.

Any one of the second to fourth configurations may be further characterized in that the auxiliary circuit further includes a stabilization switching element, wherein the stabilization switching element has: a drain electrode that is connected with the gate line corresponding to the said auxiliary circuit; and a source electrode that has the potential at the second potential level, and the stabilization switching element is not driven during the selection period in which the gate line corresponding to the stabilization switching element is selected, is driven at least during a part of the period in which the corresponding gate line is in the non-selected state, and supplies the potential at the second potential level to the corresponding gate line (the fifth configuration).

According to the fifth configuration, the potential at the second potential level is supplied to the corresponding gate line by the stabilization switching element of the auxiliary circuit, at least during a part of the period in which the corresponding gate line is in the non-selected state. This makes it possible to suppress a transition of the gate line to the selected state when the gate line is supposed to be in the non-selected state.

The fifth configuration may be further characterized in that each of the driving circuits includes an output switching element that outputs the potential of the supplied one driving signal to the gate line corresponding thereto, a first internal line that is connected to the gate of the output switching element, and a second internal line that has a potential opposite to a potential of the first internal line; the first internal line of each driving circuit has a potential equal to or greater than a threshold voltage of the output switching element when the gate line as the scanning object of the driving circuit is in the selected state; and the stabilization switching element has a gate electrode that is connected with the second internal line in the driving circuit corresponding to the gate line of the next stage with respect to the gate line as the scanning object (the sixth configuration).

According to the sixth configuration, the output switching element in the driving circuit is driven according to the potential of the first internal line, and the stabilization switching element in the auxiliary circuit is driven according to the potential of the second internal line of the driving circuit that scan the gate line of the next stage. The potential of the second internal line is opposite to that of the first internal line, and the first internal line has a potential equal to or greater than the threshold voltage of the output switching element when the gate line as a scanning object is in the selected state. The stabilization switching element is driven when the gate line of the next stage is in the non-selected state, and here, the gate line as a scanning object is in the non-selected state. Consequently, the stabilization switching element prevents from changing the state of the gate line to be in the non-selected state to the selected state.

The sixth configuration may be further characterized in that the gate electrode of the discharge switching element is connected with the first internal line in the driving circuit corresponding to the gate line of the next stage (the seventh configuration).

With the seventh configuration, the discharge switching element can be driven according to the potential of the first internal line of the driving circuit corresponding to the gate line of the next stage.

Any one of the first to seventh configurations may be further characterized in that the driving circuits include a plurality of first driving circuits for scanning odd-number-th ones of the gate lines as scanning objects, and a plurality of second driving circuits for scanning even-number-th ones of the gate lines as scanning objects; the auxiliary circuits include a plurality of first auxiliary circuits that are provided so as to correspond to the first driving circuits, respectively, and a plurality of second auxiliary circuits that are provided so as to correspond to the first driving circuits, respectively; and the first driving circuits and the second auxiliary circuits are provided outside the display area, on one end side of the gate lines, and the second driving circuits and the first auxiliary circuits are provided outside the display area, on the other end side of the gate lines (the eighth configuration).

According to the eighth configuration, outside the display area, the first driving circuits corresponding to the odd-number-th gate lines and the second auxiliary circuits corresponding to the even-number-th gate lines are provided on one of the gate line end sides, and the second driving circuits corresponding to the even-number-th gate lines and the first auxiliary circuits corresponding to the odd-number-th gate lines are provided on the other gate line end side. This therefore makes it possible to decrease the sizes of the frame regions on both end sides of the gate lines, as compared with a case where the driving circuits and the auxiliary circuits are arranged in a frame region on one end side of the gate lines.

Any one of the first to eighth configurations may be further characterized in further including a plurality of lines for the driving circuits, the lines being for supplying the M-phase driving signals to the driving circuits; and a plurality of lines for the auxiliary circuits, the lines being for supplying the M-phase driving signals to the auxiliary circuits, wherein the lines for the auxiliary circuits have a width smaller than a width of the lines for the driving circuits (the ninth configuration).

With the ninth configuration, the sizes of the frame regions can be decreased, as compared with a case where the lines for auxiliary circuits and the lines for the driving circuits have a uniform width.

Any one of the first to ninth configurations may be further characterized in that each of the driving circuits includes a plurality of switching elements; each of the auxiliary circuits includes a discharge switching element that outputs a potential at the second potential level of the supplied one driving signal to the gate line corresponding thereto; and the discharge switching element has a channel width that is smaller than a channel width of the switching elements of each of the driving circuits (the tenth configuration).

With the tenth configuration, the sizes of the frame regions can be decreased, as compared with a case where the channel width of the discharge switching element of the auxiliary circuit and the channel width of the switching element of the driving circuit have a uniform width.

The following description describes embodiments of the present invention, while referring to the drawings. Identical or equivalent parts in the drawings are denoted by the same reference numerals, and the descriptions of the same are not repeated. To make the description easy to understand, in the drawings referred to hereinafter, the configurations are simply shown or schematically shown, or the illustration of a part of constituent members is omitted. Further, the dimension ratios of the constituent members shown in the drawings do not necessarily indicate the real dimension ratios.

Embodiment 1

FIG. 1 is a schematic cross-sectional view of a display device in the present embodiment. The display device 1 in the present embodiment includes an active matrix substrate 2, a counter substrate 3, and a liquid crystal layer 4 interposed between the active matrix substrate 2 and the counter substrate 3.

Each of the active matrix substrate 2 and the counter substrate 3 includes a glass substrate that is substantially transparent (having high translucency). Further, though the illustration is omitted, the display device 1 includes a backlight that is provided so as to extend in a surface direction of the active matrix substrate 2 on a side opposite to the liquid crystal layer 4 in FIG. 1, and a pair of polarizing plates between which the active matrix substrate 2 and the counter substrate 3 are interposed. Though the illustration is omitted in this drawing, the counter substrate 3 includes color filters of three colors that are red (R), green (G), and blue (B). The following description describes the configuration of the active matrix substrate 2.

Figure 2A:
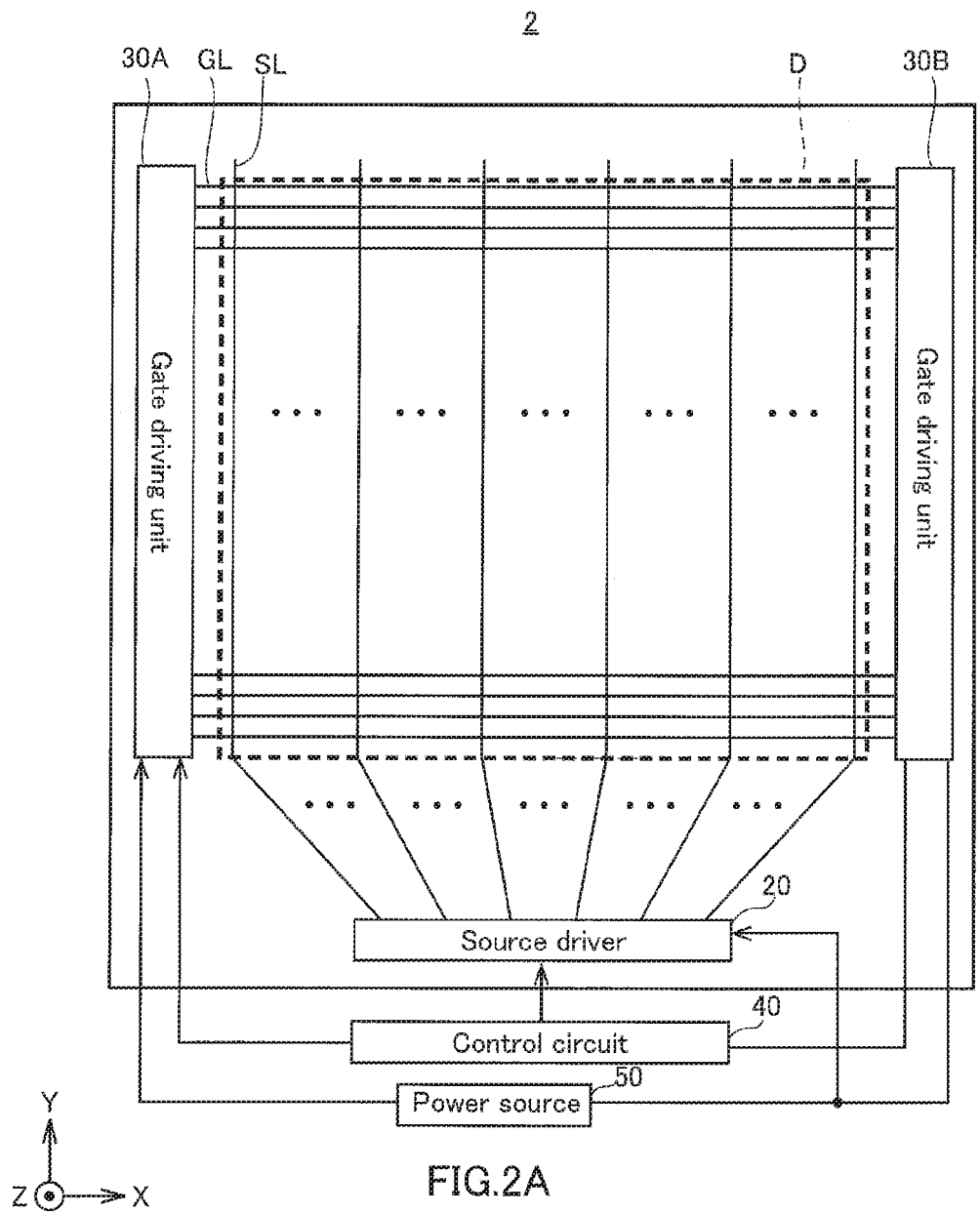
FIG. 2A is a plan view illustrating a schematic configuration of the active matrix substrate shown in FIG. 1.

FIG. 2A is a plan view illustrating a schematic configuration of the active matrix substrate 2. As shown in FIG. 2A, the active matrix substrate 2 includes a plurality of gate lines GL, a plurality of source lines SL, a source driver 20, and gate driving units 30 (30A, 30B). Further, the active matrix substrate 2 is connected with a control circuit 40 and a power source 50 through, for example, a flexible printed circuit (FPC) (not shown).

Through the illustration is omitted in FIG. 2A, the active matrix substrate 2 includes a plurality of pixels that are provided with pixel electrodes, respectively, and are arranged in areas defined by the gate lines GL and the source lines SL, respectively; and the active matrix substrate 2 has a display area D that is composed of all of the pixels. Further, the active matrix substrate 2 includes a common electrode that is opposed to the pixel electrodes with an insulating film being interposed therebetween. The alignment of liquid crystal molecules in each pixel is controlled by the pixel electrode and the common electrode by the horizontal electric field method. Each pixel corresponds to any one of the colors R, G, B of the color filters (not shown) provided on the counter substrate 3.

Figure 2B:
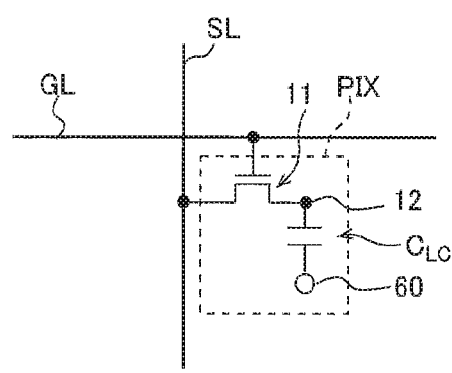
FIG. 2B is an equivalent circuit diagram of one pixel.

FIG. 2B shows an equivalent circuit of one pixel. The pixel PIX includes, for example, a pixel switching element 11 formed with a thin film transistor, a pixel electrode 12, and a common electrode 60. In the pixel switching element 11, the gate electrode thereof is connected with the gate line GL, the source electrode thereof is connected with the source line SL, and the drain electrode thereof is connected with the pixel electrode 12. Between the pixel electrode 12 and the common electrode 60, a liquid crystal capacitor CLC is formed.

As shown in FIG. 2A, the source driver 20 and the gate driving units 30 (30A, 30B) are provided outside the display area D. The gate driving unit 30A is provided in the frame region on the left side to the display area D as viewed in FIG. 2A, and the gate driving unit 30B is provided in the frame region on the right side to the display area D as viewed in FIG. 2A. The gate driving units 30A, 30B and the source driver 20 are connected with the control circuit 40 and the power source 50. The gate driving units 30A, 30B and the source driver 20 are driven based on control signals supplied from the control circuit 40 and power source voltage signals supplied from the power source 50.

The control circuit 40 supplies, to the gate driving units 30A, 30B, control signals including clock signals for driving the gate driving units 30A, 30B, timing signals and the like. Further, the control circuit 40 supplies, to the source driver 20, timing signals indicating the data writing timing, and data signals.

The power source 50 supplies a power source voltage signal VDD and a power source voltage signal VSS to the gate driving units 30A, 30B and the source driver 20.

The source driver 20 is provided in a frame region that is outside the display area D and on one side of the ends of the source lines SL, and is connected with all of the source lines SL. The source driver 20 is driven based on the power source voltage signals supplied from the power source 50, as well as timing signals and data signals supplied from the control circuit 40, and supplies, to each source line SL, a gray level signal indicating a gray level of an image to be written in each pixel.

(Gate Driving Unit)

Figure 3:
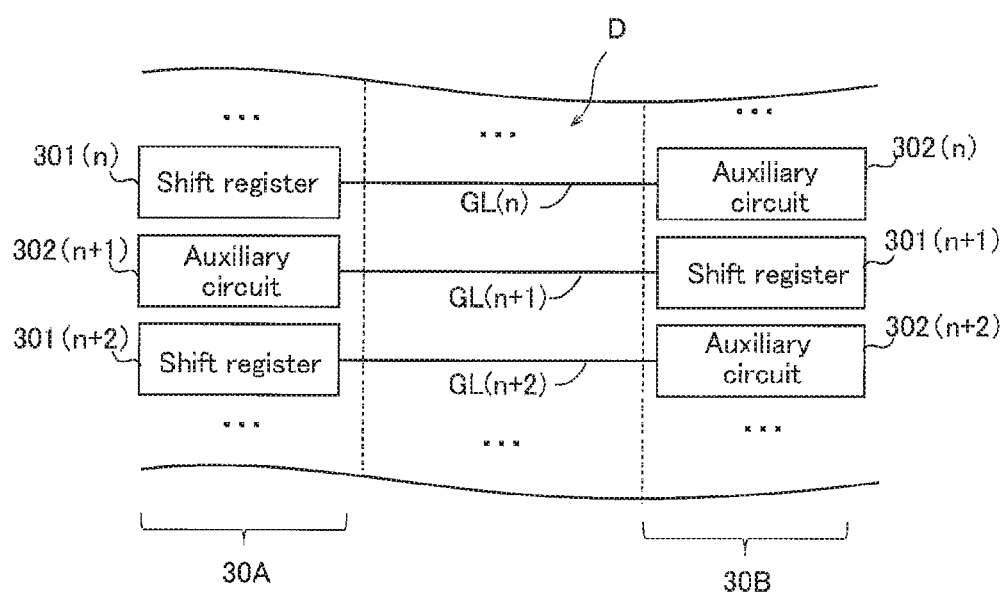
FIG. 3 schematically shows a schematic circuit configuration of the gate driving unit shown in FIG. 2A.

FIG. 3 schematically shows a schematic circuit configuration of the gate driving units 30A and 30B. As shown in FIG. 3, the gate driving unit 30A, which is arranged on the left side so that the display area D is interposed between the gate driving units 30A and 30B, includes a shift register 301(n), an auxiliary circuit 302(n+1), and a shift register 301(n+2) (n is a natural number of 1 or greater). Further, the gate driving unit 30B, which is arranged on the right side so that the display area D is interposed between the gate driving units 30A and 30B, includes an auxiliary circuit 302(n), a shift register 301(n+1), and an auxiliary circuit 302(n+2). In the present embodiment, one set of the shift register (driving circuit) and the auxiliary circuit is provided so as to correspond to each gate line GL. In the following description, when the shift registers are not distinguished individually, the shift registers are generally referred to as shift registers 301, and when the auxiliary circuits are not distinguished individually, the auxiliary circuits are generally referred to as auxiliary circuits 302.

Each of the shift registers 301(n) to 301(n+2) charges a corresponding one of the gate lines GL(n) to GL(n+2) to a potential corresponding to the selected state (selection potential), or discharges the same to a potential corresponding to the non-selected state (non-selection potential). Each of the auxiliary circuits 302(n) to 302(n+2) discharges a corresponding one of the gate lines GL(n) to GL(n+2) to the non-selection potential. Hereinafter, the charging of the gate line so that the gate line has the selection potential is referred to as scanning or driving of the gate line in some cases.

In this way, the shift register 301 and the auxiliary circuit 302 that charge/discharge one gate line GL are provided in the frame regions that are on the opposite sides, respectively, with the display area D being interposed therebetween. Such an arrangement allows the width of the frame regions to decrease, as compared with a case where one set of the shift register 301 and the auxiliary circuit 302 are provided in the same frame region.

The shift registers 301 in the gate driving unit 30A scan the gate lines GL of the odd-number-th rows, and the shift registers 301 in the gate driving unit 30B scan the gate lines GL of the even-number-th rows. The auxiliary circuits 302 in the gate driving unit 30A sequentially switch the odd-number-th gate lines GL to a non-selected state, and sequentially switch the even-number-th gate lines GL to a non-selected state.

(Shift Register)

Figure 4:
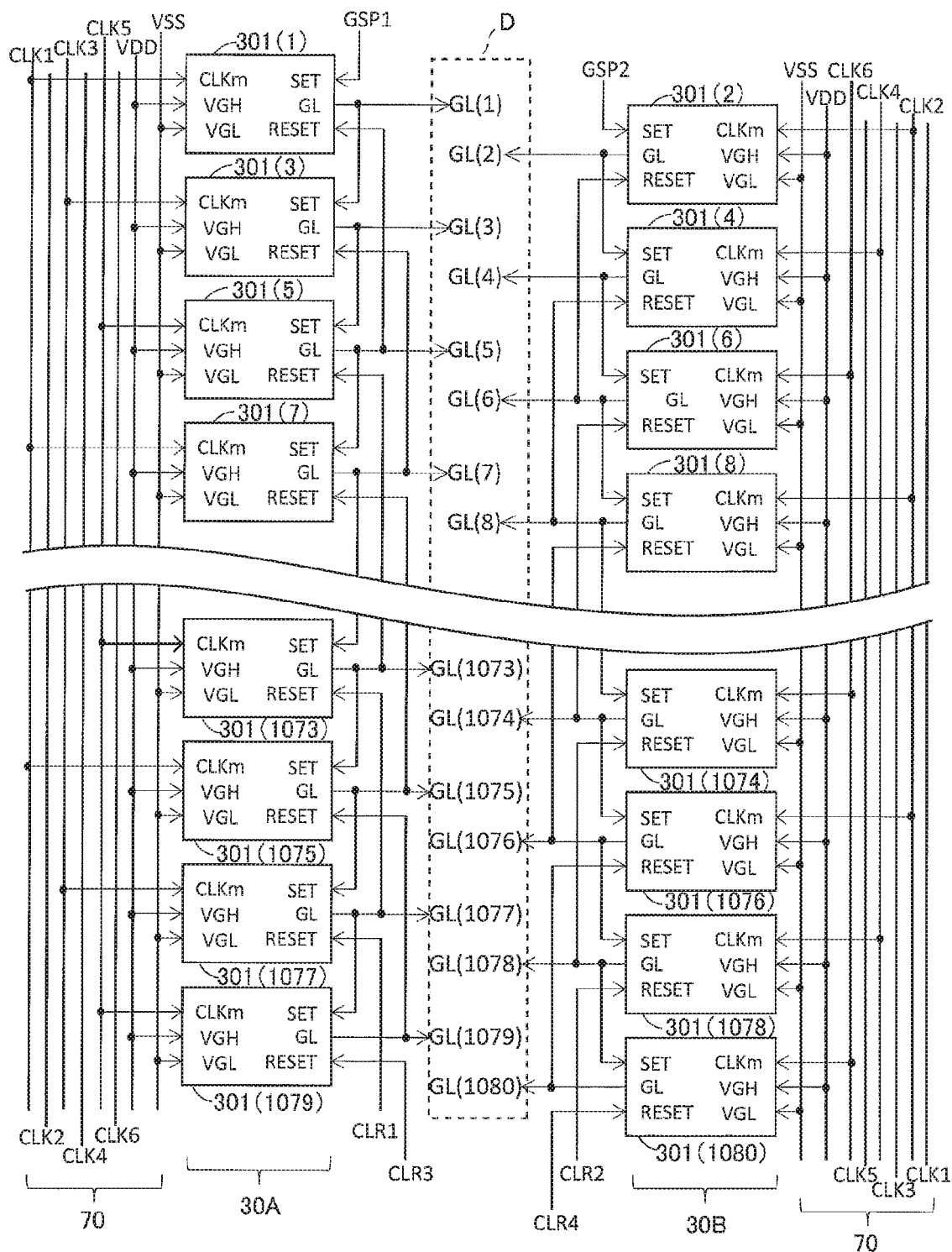
FIG. 4 schematically shows control signals supplied to the shift registers shown in FIG. 3, and connection relationship of the shift registers.
Figure 5:
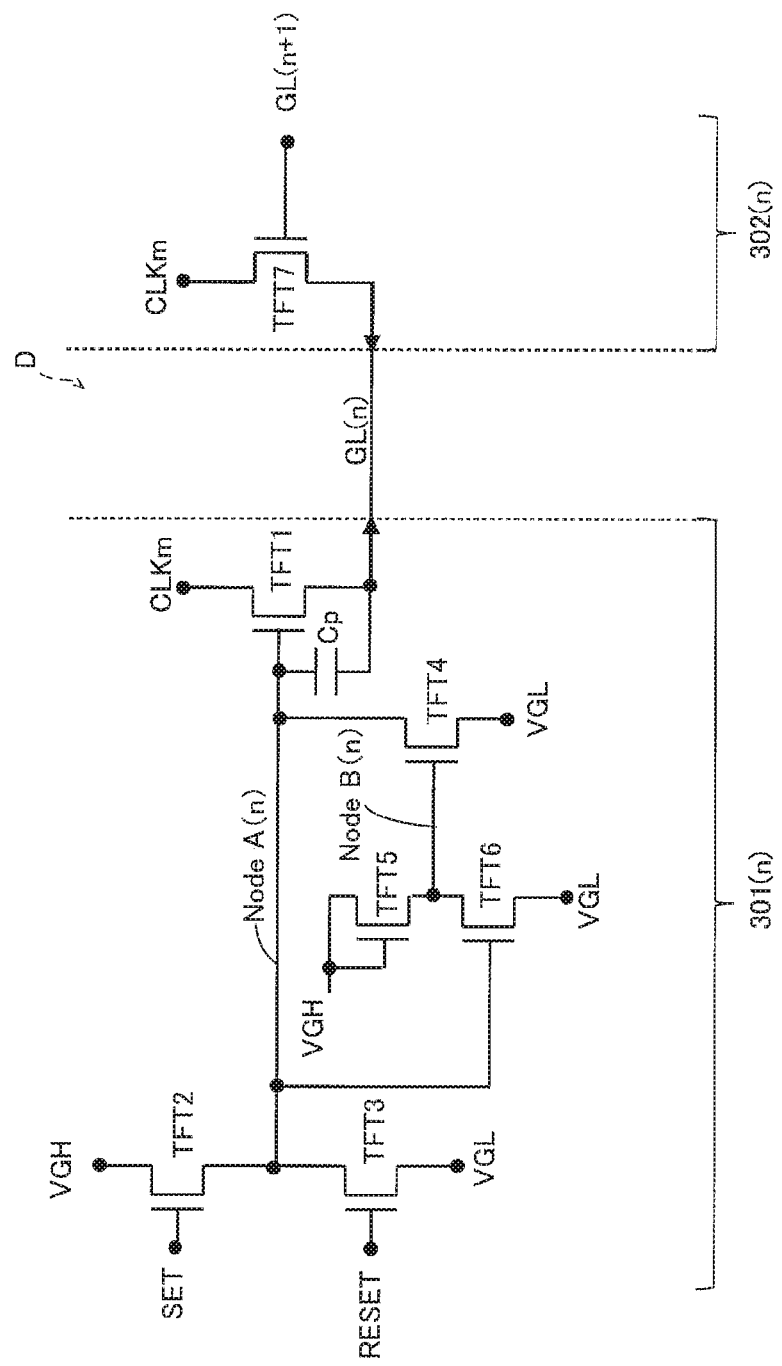
FIG. 5 shows an equivalent circuit of one shift register and one auxiliary circuit shown in FIG. 3.

Next, the following description describes the configuration of the shift register 301, while referring to FIGS. 4 and 5. FIG. 4 schematically shows control signals supplied to the shift registers 301, and the connection relationship of the shift registers 301. In FIG. 4, for convenience sake, the illustration of the auxiliary circuits 302, the control circuit 40, and the power source 50 is omitted. Further, this example is described with reference to an exemplary configuration in which 1080 gate lines GL(1) to GL(1080) are provided, but the number of the gate lines is not limited to this. FIG. 5 is an equivalent circuit of the shift register 301(n) and the auxiliary circuit 302(n) corresponding to the gate line GL(n).

As shown in FIG. 4, in the frame region of the active matrix substrate 2, lines 70 for connecting the control circuit 40 and the power source 50 (see FIG. 2A) with the shift registers 301 are arranged.

The control circuit 40 (see FIG. 2A) supplies the clock signals (CLK1 to CLK6), the gate start pulses (GSP1, GSP2), and the reset signals (CLR1 to CLR4) through the lines 70. The power source 50 (see FIG. 2A) supplies the power source voltage signals (VDD, VSS) through the lines 70.

The shift register 301 includes a CLKm terminal, a VGH terminal, a VGL terminal, a SET terminal, a GL terminal, and a RESET terminal.

To the CLKm terminal, any one of the clock signals CLK1 to CLK6 is input. To the VGH terminal, the power source voltage signal VDD is inputted. To the VGL terminal, the power source voltage signal VSS is inputted. The potential of the power source voltage signal VDD is equivalent to the selection potential, and the potential of the power source voltage signal VSS is equivalent to the non-selection potential.

To the GL terminal, the potential of the gate line GL corresponding o the GL terminal is inputted.

To the SET terminal, the gate start pulse (GSP1/GSP2), or the potential of GL terminal of the shift register 301 at the subsequent stage in the gate driving unit 30A or 30B is inputted, as a set signal for driving the shift register 301.

In this example, the gate start pulse GSP1 is inputted to the SET terminal of the shift register 301(1), and the gate start pulse GSP2 is inputted to the shift register 301(2). In other words, to the shift registers 301 corresponding to the gate lines GL(1), GL(2) of the first and second stages, the gate start pulses GSP1, GSP2 are supplied from the control circuit 40, respectively. In contrast, to the SET terminals of the shift registers 301 corresponding to the gate lines of the third stage and the subsequent stages, potentials are inputted in the following manner: to the shift register 301 corresponding to the odd-number-th gate line, the potential of the GL terminal of the shift register 301 that is in the previous stage and corresponds to the odd-number-th gate line is inputted, and to the shift register 301 corresponding to the even-number-th gate line, the potential of the GL terminal of the shift register 301 that is in the previous stage and corresponds to the even-number-th gate line is inputted. In other words, to the SET terminal of the shift register 301 corresponding to the gate line GL of the third stage or a stage ahead, the potential of the gate line GL of the stage that is two stages behind the gate line as a scanning object of the shift register 301 concerned is inputted.

To the RESET terminal, the CLR signal or the potential of the GL terminal of the shift register 301 two stages ahead in the gate driving unit 30A or 30B is inputted, as a reset signal for stopping the driving of the shift register 301.

Figure 6:
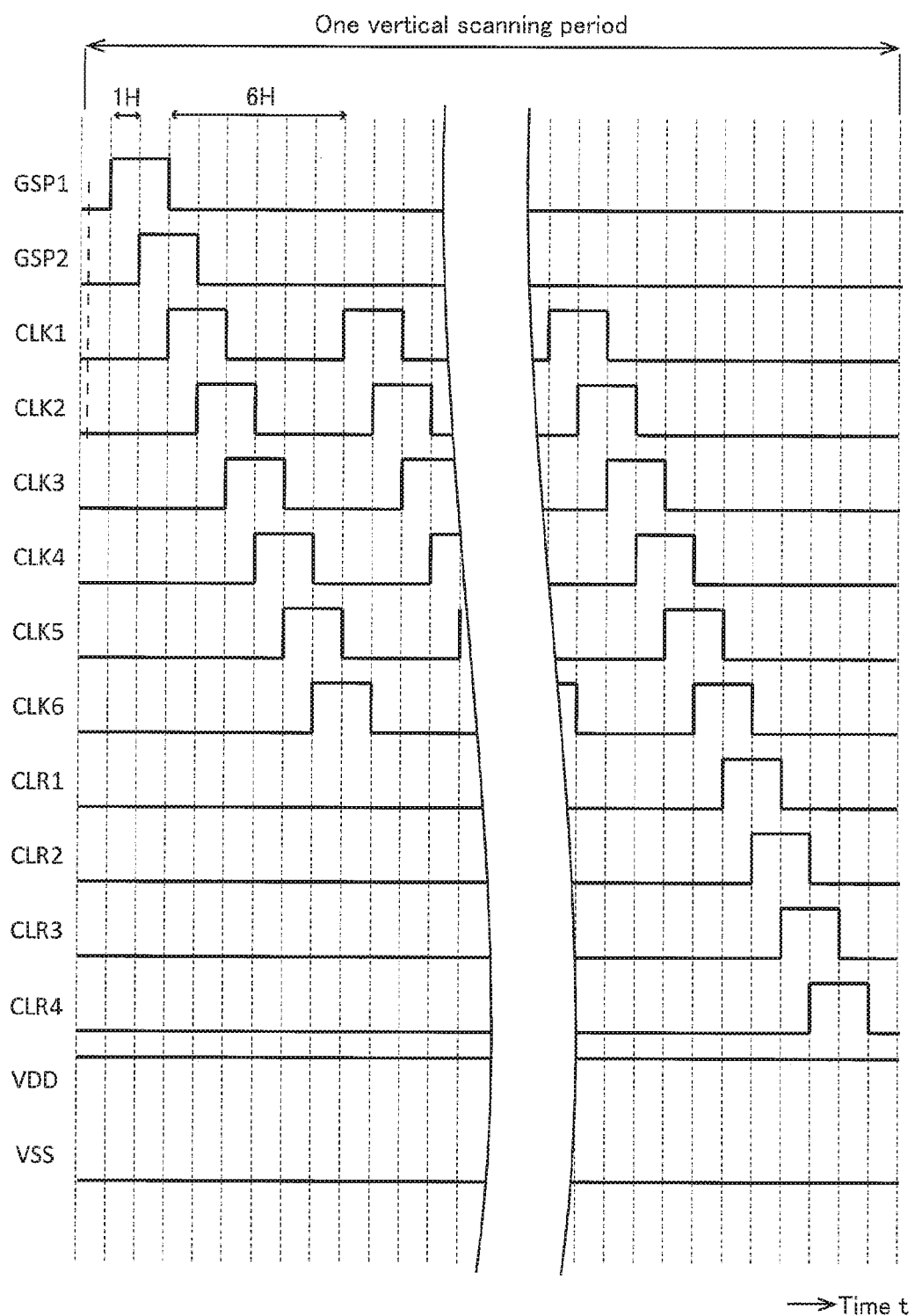
FIG. 6 is a waveform diagram that shows respective potentials of gate start pulse signals, clock signals, reset signals, and power source voltage signals in Embodiment 1.

Here, FIG. 6 is a waveform diagram that shows respective potentials of the signals, i.e., the gate start pulse signals, the clock signals, the reset signals, and the power source voltage signals. The potentials of the signals shown in FIG. 6 indicate potential changes during one vertical scanning period.

As shown in FIG. 6, the potential of the gate start pulse GSP1 rises to the H (High) level at the beginning of the one vertical scanning period, and thereafter, with one horizontal scanning period (1H) delay, the potential of the gate start pulse GSP2 rises to the H level. Each of the gate start pulses GSP1, GSP2 maintains the potential at the H level during two horizontal scanning periods, and thereafter, makes a transition to the potential at the L (Low) level.

The clock signals CLK1 to CLK6 are six-phase clock signals having phases that are different from one another, respectively. Each clock signal cyclically repeats the following potential change: each clock signal has the potential at the H level during two horizontal scanning periods in the six horizontal scanning periods, and has the potential at the L level during the other four horizontal scanning periods. The clock signals CLK1 to CLK6 have phase shifts of one horizontal scanning period each in this order. The H-level potential of the clock signal is equivalent to the selection potential, and the L-level potential of the clock signal is equivalent to the non-selection potential. Incidentally, each of the clock signals CLK1 to CLK6 has a L-level potential after the gate line GL scanned last makes a transition from the selected state to the non-selected state, until the next one vertical scanning period starts.

To the CLM terminal of the shift register 301 in the gate driving unit 30A, that is, the shift register 301 corresponding to the gate line GL of the odd-number-th row, a clock signal is inputted, which is any one of the clock signals CLK1, CLK3, CLK5, and has a phase that is delayed by two horizontal scanning periods as compared with the phase of the shift register 301 corresponding to the odd-number-th gate line of the previous stage. Further, to the CLM terminal of the shift register 301 in the gate driving unit 30B, that is, the shift register 301 corresponding to the even-number-th gate line GL, a clock signal is inputted, which is any one of the clock signals CLK2, CLK4, CLK6, and has a phase that is delayed by two horizontal scanning periods as compared with the phase of the shift register 301 corresponding to the even-number-th gate line of the previous stage.

The CLR signals denoted by "CLR1" to "CLR4" are reset signals that have a potential at the H level during two horizontal scanning periods exclusively in one vertical scanning period. The periods while the CLR signals CLR1 to CLR4 have the potential at the H level are shifted from one another by one horizontal scanning period each. The CLR signal CLR1 has a potential that rises to the H level one horizontal scanning period after the gate line GL of the last stage, which is scanned last, makes a transition to the selected state.

The CLR signals CLR1 to CLR4 are inputted to the RESET terminals of the shift registers 301 corresponding to the gate lines GL(1077) to the gate line GL(1080) of the last stage shown in FIG. 4, respectively.

Incidentally, to each of the RESET terminals of the shift registers 301 that scan the gate lines GL other than the gate lines GL(1077) to GL(1080) of the last stage, the potential of the GL terminal of the shift register 301 that is two stages ahead in the gate driving unit 30A or 30B in which the shift register 301 concerned is located is inputted as the reset signal. In other words, to the RESET terminal of the shift register 301 to which the CLR signal is not supplied, the potential of the gate line GL of a stage that is four stages ahead with respect to the gate line GL that the shift register 301 scans as the scanning object is inputted.

The power source voltage signal VDD maintains the potential at the H level during one vertical scanning period, and the power source voltage signal VSS maintains the potential at the L level during one vertical scanning period.

The following description describes the circuit configuration of the shift register 301(n) and the auxiliary circuit 302(n) (1080≥n≥1).

As shown in FIG. 5, the shift register 301(n) includes switching elements denoted by "TFT 1" to "TFT 6", internal lines (a node A(n), and a node B(n)), and a capacitor Cp.

The node A(n) is an internal line that connects the gate of TFT 1, the source of TFT 2, the drain of TFT 3, the gate of TFT 6, and the drain of TFT 4. The node B(n) is an internal line that connects the gate of TFT 4, the source of TFT 5, and the drain of TFT 6.

In TFT 2, the set signal is inputted to the SET terminal on the gate side, the power source voltage signal VDD is inputted to the VGH terminal on the drain side, and the source of TFT 2 is connected with the node A.

In TFT 3, the reset signal is inputted to the gate side RESET terminal, the drain thereof is connected with the node A, and the power source voltage signal VSS is inputted to the VGL terminal on the source side.

In TFT 4, the gate thereof is connected with the node B, the drain thereof is connected with the node A(n), and the power source voltage signal VSS is inputted to the VGL terminal on the source side.

In TFT 5, the gate thereof and the drain thereof are connected with each other, the power source voltage signal VDD is inputted to the gate thereof and the VGH terminal on the drain side, and the source of TFT 5 is connected with the node B(n).

The gate of TFT 6 is connected with the node A, the drain thereof is connected with the node B, and the power source voltage signal VSS is inputted to the VGL terminal on the source side. Incidentally, in this example, TFT 6 has a size greater than that of TFT 5, and has a greater drive capability than that of TFT 5.

In the capacitor Cp, one of the electrodes thereof is connected with the node A(n), and the other electrode is connected with the gate line GL(n) and the source of TFT 1. Incidentally, in the present embodiment, the capacitor Cp is provided in the shift register 301, but TFT 1 has a large capacitance, the capacitor Cp does not have to be provided.

In TFT 1, the gate thereof is connected with node A, any one of the clock signals CLK1 to CLK6 is inputted to the CLKm terminal thereof on the drain side, and the source thereof is connected with the gate line GL(n).

The auxiliary circuit 302(n) includes TFT 7 as a switching element. The gate of TFT 7 is connected with the gate line GL(n+1), and the source thereof is connected with the gate line GL(n). Further, in TFT 7, the same clock signal as that supplied to the shift register 301(n) is inputted to the CLKm terminal thereof on the drain side.

In this example, TFT 1 of the shift register 301(n) is an output switching element that outputs a selection potential or a non-selection potential to the gate line GL(n). TFT 7 of the auxiliary circuit 302(n) is a discharge switching element that outputs a voltage for switching the gate line GL(n) to the non-selected state.

(Operation)

Figure 7:
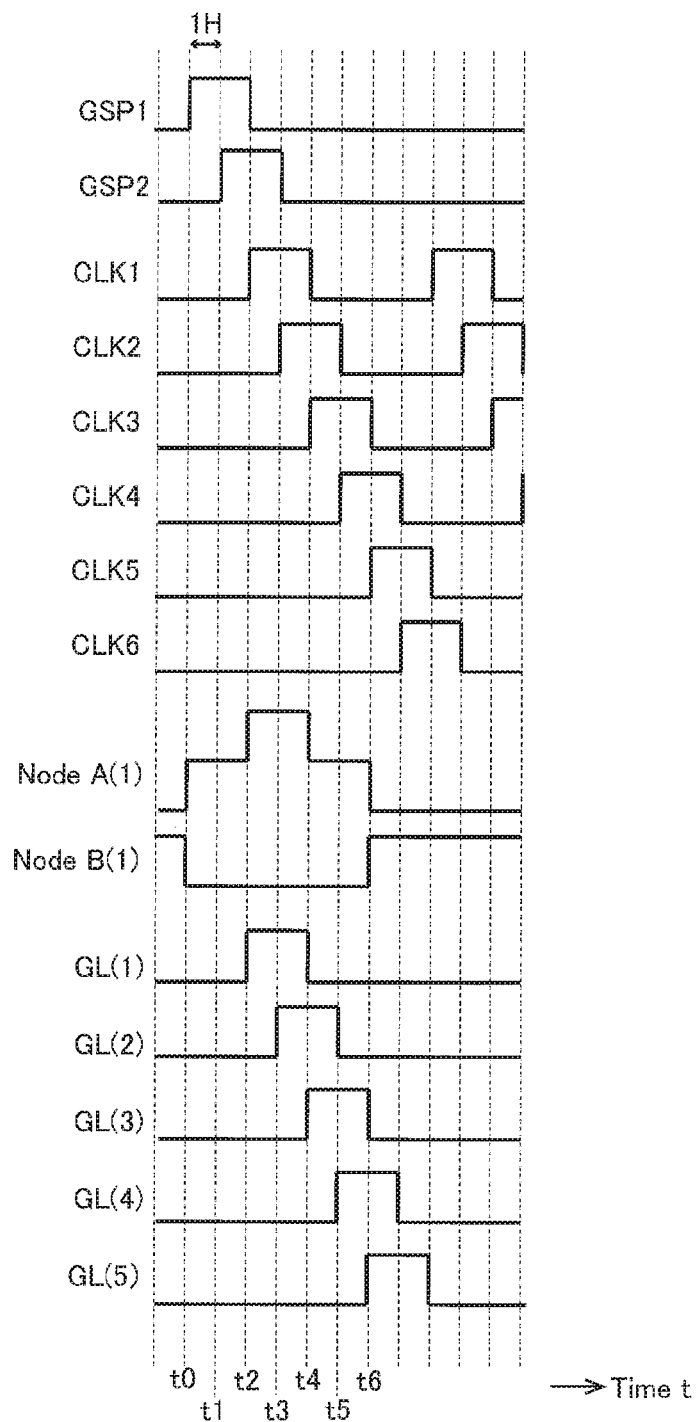
FIG. 7 is a waveform diagram that shows potential changes at the nodes in the shift register and the gate lines.

Here, operations of the shift register 301(n) and the auxiliary circuit 302(n) are described. FIG. 7 is a waveform diagram that shows potential changes at the node A, the node B, the gate lines GL(n) and GL(n+1) in the shift register 301(n) in a case where the clock signal supplied to the shift register 301(n) and the auxiliary circuit 302(n) is the clock signal CLK1. Here, the case of the shift register 301(1) and the auxiliary circuit 302(1) is described as an example.

The following description refers to FIGS. 5 and 7. After one vertical scanning period starts, in the shift register 301(1), the gate start pulse GSP1 having the potential at the H level (see FIG. 6) is inputted to the SET terminal of TFT 2 during a period from the time t0 to the time t2. This causes TFT 2 to be turned ON, and a potential Va1 that is lower by the threshold voltage Vth2 of the TFT 2 than the potential of the power source voltage signal VDD at the VGH terminal of TFT 2 ((VDD-Vth2)>VSS) is outputted to the node A. Here, the potential of the RESET terminal of TFT 3 is at the L level, whereby TFT 3 is in the OFF state.

TFT 5 is always kept in the ON state due to the potential of the power source voltage signal VDD of the VGH terminal. In TFT 5, the gate thereof and the drain thereof are diode-connected, so that potential Vb1, which is lower by the threshold voltage Vth5 of TFT 5 than the power source voltage signal VDD ((VDD-Vth5))>VSS), is outputted to the node B(1). TFT 6 is turned ON when the potential of the node A(1) is greater than the threshold voltage of TFT 6. The potential Vb1 is greater than the threshold voltage of TFT 6. Further, TFT 6 has a drive capability that is greater than that of TFT 5. When TFT 6 is in the ON state, that is, when the potential of the node A(1) is Va1 (>VSS), the node B(1) therefore has a potential at the L level (a potential close to VSS) through the VGL terminal of TFT 6. This causes TFT 4 to maintain the OFF state.

The node A(1) therefore maintains the potential Va1 during the period from time t0 to time t2 and TFT 1 is in the ON state, but since the potential of the clock signal CLK1 is at the L level, the gate line GL(1) maintains the potential at the L level.

At time t2, when the potential of the clock signal CLK1 makes a transition from the L level to the H level, the potential of the node A is boosted exclusively by ΔVc through the capacitor Cp, whereby the node A has a potential Va2 (Va1+ΔVc), which is ΔVc higher than the potential Va1. Since TFT 1 is in the ON state, the potential at the H level of the clock signal CLK1 at the CLKm terminal of TFT 1 is outputted to the gate line GL(1). Thus, during the two horizontal scanning periods from time t2 to time t4, while the potential of the clock signal CLK1 is at the H level, the gate line GL(1) becomes selected.

At time t4, when the potential of the clock signal CLK1 makes a transition to the L level, the potential at the node A(1) makes a transition from Va2 to Va1. Here, TFT 6 is in the ON state, and the node B(1) maintains the potential at the L level.

Incidentally, the gate start pulse GSP2 having a potential at the H level is inputted to the SET terminal of the shift register 301(2), at a timing that is delayed by one horizontal scanning period with respect to the gate start pulse GSP1.

The shift register 301(2) has the same configuration as that of the shift register 301(1) except that the clock signal CLK2 supplied thereto has a phase that is delayed by one horizontal scanning period with respect to the clock signal CLK1. The potentials of the node A(2) and the node B(2) of the shift register 301(2) therefore change at timings that are delayed by one horizontal scanning period with respect to the timings for the node A(1) and the node B(1) of the shift register 301(1), respectively, and at time t3, which is one horizontal scanning period after time t2 when the gate line GL(1) becomes selected, the potential at the H level (VDD) is input to the gate line GL(2), whereby the gate line GL(2) becomes selected.

At time t3, the potential of the gate line GL(2) makes a transition to the H level, and TFT 7 of the auxiliary circuit 301(1) is turned ON. This causes the potential of the CLKm terminal of TFT 7 to be output to the gate line GL(1). During a period from time t3 to time t4, the potential of the clock signal CLK1 is at the H level. During one horizontal scanning period from time t3 to time t4, therefore, an auxiliary potential Vsh that is lower by the threshold voltage Vth7 of TFT 7 than the potential VDD ((VDD-Vth7)>VSS) is output via TFT 7 to the gate line GL(1). Incidentally, a period in which the auxiliary potential Vsh is being applied to the gate line GL(1) is a period in which the auxiliary potential Vsh has a potential greater than that of the gate line GL(1).

One horizontal scanning period in the selection period (two horizontal scanning periods) in which the gate line GL(1) is selected, and one horizontal scanning period in the selection period in which the gate line GL(2) is selected, overlap with each other. The source driver 20 supplies data signals for the pixels corresponding to the gate line GL(1) during a period from time t3 to time t4, and carries out a data writing operation. In other words, the period from time t2 to time t3 in the gate line GL(1) selection period is a precharging period for pre-charging the gate line GL(1), and the period from time t3 to time t4 is a main charging period for the gate line GL(1). Likewise, in the gate line GL(2) selection period, the period from time t3 to time t4 is a pre-charging period, and the period from time t4 to time t5 is a main charging period.

In other words, in the pre-charging period and the main charging period for one gate line GL(n), the gate line GL(n) is charged to the selection potential. In the pre-charging period, data are written in the pixels that correspond to the gate line GL(n−1), and in the main charging period, data are written in the pixels that correspond to the gate line GL(n).

Accordingly, in the period from time t3 to time t4, which is the main charging period for the gate line GL(1), the auxiliary potential Vsh (>VSS) is inputted to the gate line GL(1) via TFT 7 of the auxiliary circuit 302(1). In other words, the potential at the H level is inputted through one end of the gate line GL(1) by the shift register 301(1), and the auxiliary potential Vsh (>VSS) is inputted through the other end thereof by the auxiliary circuit 302(1). Incidentally, the period in which the auxiliary potential Vsh is applied to the gate line GL(1) is the period in which the potentials of the gate line GL(n+1) and the clock signal CLK1 are at the H level (the period from t3 to t4) and while the auxiliary potential Vsh is greater than the potential of the gate line GL(1). This therefore makes it unlikely that the charging of the selection voltage to the gate line GL(1) would be delayed and accordingly the display quality would be impaired, as compared with a case where the gate line GL(1) is switched to the selected state by the shift register 301(1) alone.

At time t4, the potential of the clock signal CLK1 makes a transition to the L level. Since TFT 1 is in the ON state during the period in which the node A(1) has a potential equal to or greater than the potential Va1 (the period from t0 to t6), the potential at the L level is supplied to the gate line GL(1) via TFT 1. Further, here, TFT 7 of the auxiliary circuit 302(1) is also in the ON state, the auxiliary potential Vsl at the L level is inputted to the gate line GL(1) via TFT 7. In other words, the potential at the L level is inputted to both of the ends of the gate line GL(1), whereby the gate line GL(1) becomes non-selected. This makes it possible to switch the gate line GL(1) to the non-selected state quickly and surely, as compared with a case where the gate line GL(1) is switched to the non-selected state by the shift register 301(1) alone. As a result, it is unlikely that display defects would occur due to delays in the supply of the non-selection voltage to the gate lines GL.

The gate lines GL(2) to GL(5) are sequentially switched to the selected state by the corresponding shift registers 301(2) to 301(5), respectively, in the same manner as that for the gate line GL(1). At time t6, the gate line GL(5) makes a transition to the selected state, and TFT 3 in the shift register 301(1) is turned ON, whereby the potential of the node A(1) falls to the L level (VSS). This causes TFT 6 to be turned OFF, causes the node B to make a transition to Vb1 (>VSS) via TFT 5, and causes TFT 4 to be turned ON. During a period in which TFT 4 is in the ON state, that is, a period in which the node B(1) has the potential Vb1, the node A(1) maintains the potential at the L level via TFT 4.

The shift registers 301 and the auxiliary circuits 302 that correspond to the gate lines GL other than the gate line GL(1) are also driven in the same manner as that for the shift register 301(1) and the auxiliary circuit 302(1). Incidentally, since the number of the gate lines GL is 1080, the same signal as the signal CLR1 shown in FIG. 6 is inputted to the gate of TFT 7 of the auxiliary circuit 302 corresponding to the gate line GL(1080) of the last stage. In other words, a signal whose potential rises to the H level after one horizontal scanning period after the gate line GL(1080) makes transition to the selected state is inputted to the gate of TFT 7. Further, the same signal CLK6 (see FIG. 6) as that for the shift register 301(1080) is inputted to the CLKm terminal of TFT 7. With this configuration, TFT 7 of the auxiliary circuit 302 is in the ON state during the main charging period for the gate line GL(1080), and when the main charging period for the gate line GL(1080) ends, the potential at the L level of the signal CLK6 is inputted to the gate line GL(1080) via TFT 7.

Embodiment 2

Embodiment 1 described above is described with reference to an exemplary case where the CLR signal is supplied to the gate of TFT 7 of the auxiliary circuit 302 corresponding to the gate line GL of the last stage, so as to drive TFT 7. As the present embodiment, an example is described in which TFT 7 is driven by a method that is different from that in Embodiment 1.

Figure 8:
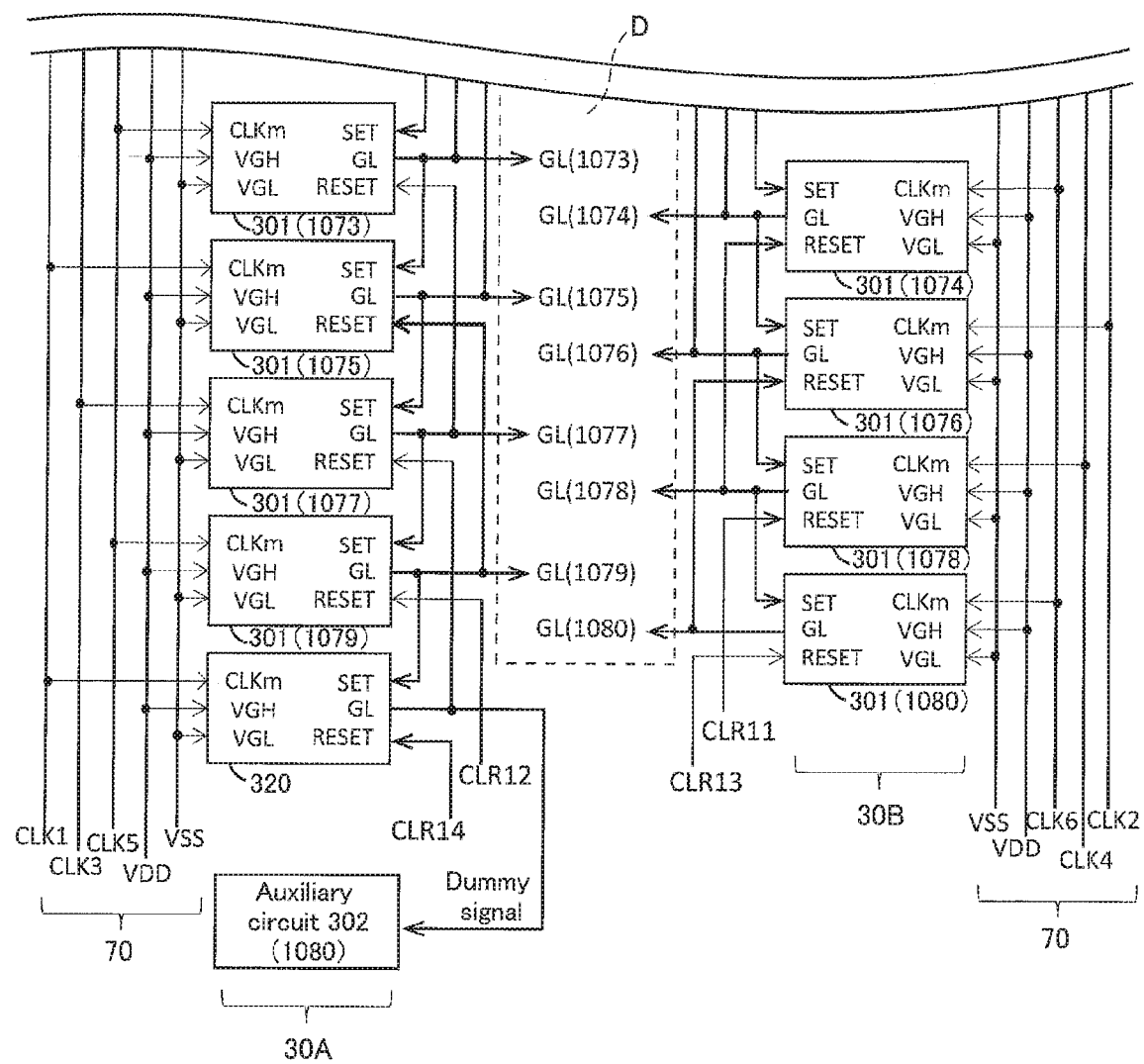
FIG. 8 schematically shows a schematic configuration of a shift register in Embodiment 2.

FIG. 8 schematically shows a schematic configuration of some of the shift registers 301 in the present embodiment. In FIG. 8, the same configurations as those in Embodiment 1 are denoted by the same reference symbols as those in Embodiment 1. The following description principally describes configurations different from those in Embodiment 1.

As shown in FIG. 8, an active matrix substrate 2A of the present embodiment includes dummy shift registers 320 in a gate driving unit 30A.

The dummy shift register 320 has the same circuit configuration as that of the shift register 301 shown in FIG. 5. The GL terminal of the dummy shift register 320, however, is connected with, not the gate line GL, but TFT 7 (see FIG. 5) of the auxiliary circuit 302(1080) corresponding to the gate line GL(1080) of the last stage. The SET terminal of the dummy shift register 320 is connected with the GL terminal of the shift register 301(1079) of the previous stage in the gate driving unit 30A, that is, the gate line GL(1079). Further, the clock signal CLK1 is inputted to the CLKm terminal of the dummy shift register 320.

Further, in the present embodiment, the RESET terminal of the shift register 301(1077) is connected with the GL terminal of the dummy shift register 320, and the signals CLR11, CLR12, and CLR13 are input, as reset signals, to the RESET terminals of the shift registers 301(1078) to 301

(1080), respectively. To the RESET terminal of the dummy shift register 320, the signal CLR14 is inputted.

The signals CLR11 to CLR14 are signals that maintain the potential at the H level during only two horizontal scanning periods in one vertical scanning period, and maintain the potential at the L level during the other periods, as is the case with the CLR signal in Embodiment 1. Details of these CLR signals are described in the following description about the operations.

Figure 9A:
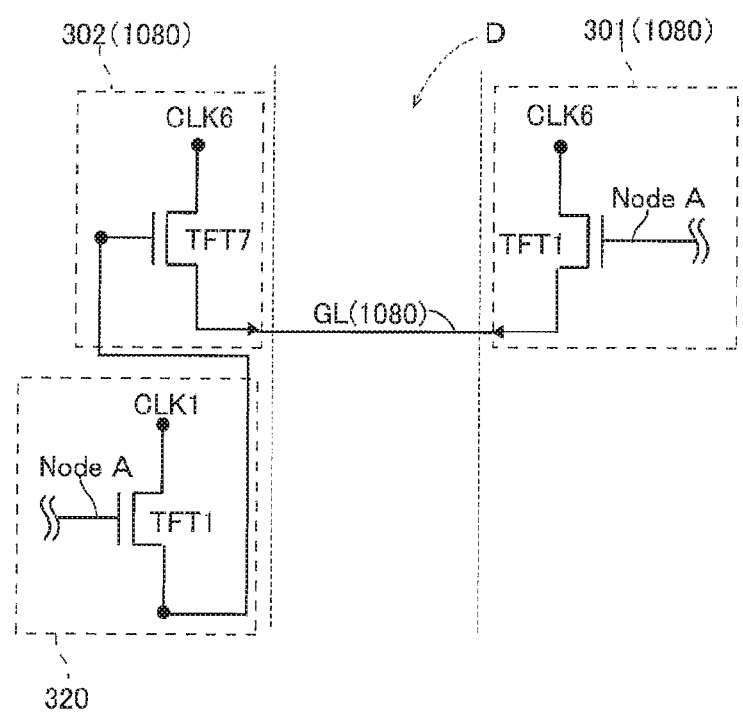
FIG. 9A shows TFT 1 of a shift register corresponding to a last-stage gate line, and TFT 7 of an auxiliary circuit, which are extracted therefrom and shown.

Next, an operation for switching the gate line GL(1080) of the last stage to the non-selected state is described. In FIG. 9A, TFT 1 of the shift register 301(1080) and TFT 7 of the auxiliary circuit 302(1080) corresponding to the gate line GL(1080) of the last stage are extracted and shown, while the illustration of the other elements is omitted. Further, FIG. 9B is a timing chart that shows potential changes of the gate lines GL(1075) to GL(1080) and a dummy signal.

As shown in FIG. 9A, the clock signal CLK6 is inputted to the drains of the shift register 301(1080) and the auxiliary circuit 302(1080).

Figure 9B:
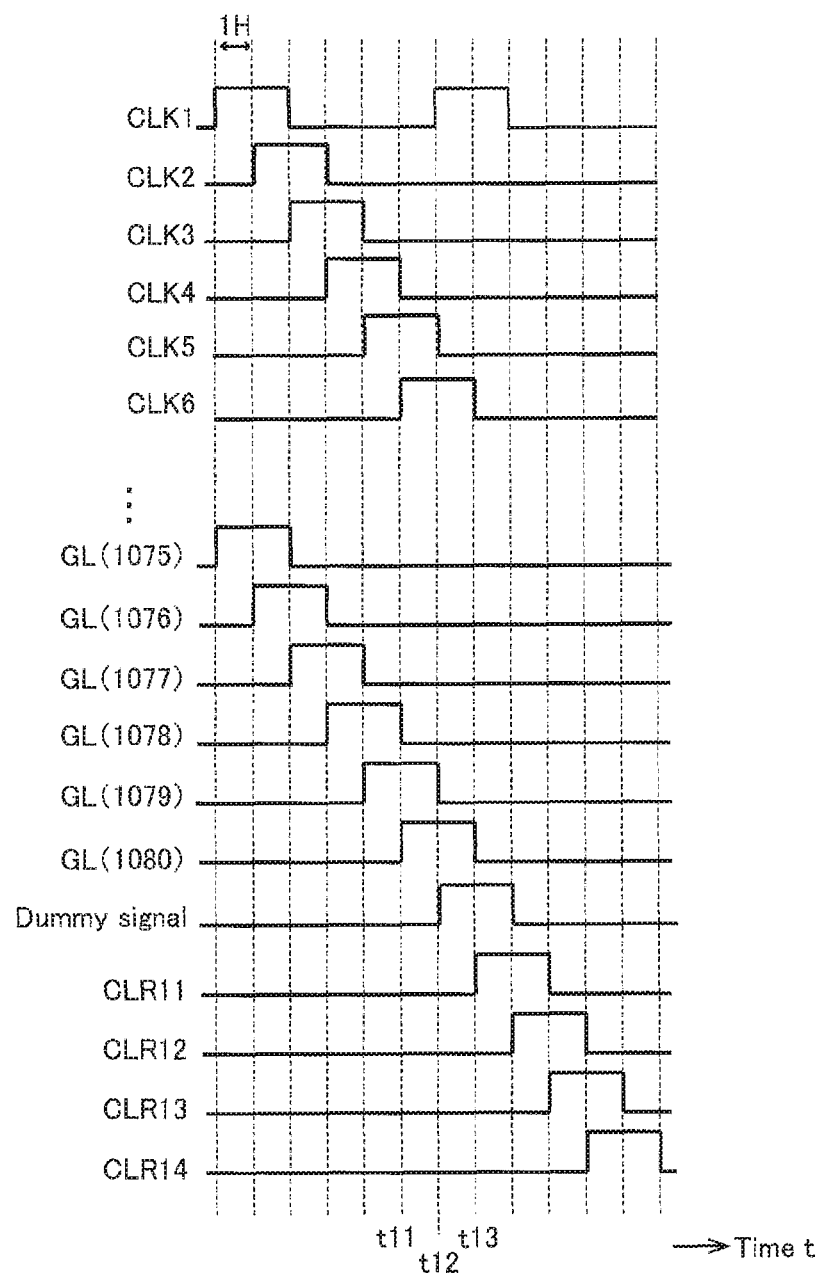
FIG. 9B is a timing chart illustrating potential changes of clock signals, a part of the gate lines, and CLR signals.

As shown in FIG. 9B, at time t11, when the potential of the clock signal CLK6 makes a transition to the H level, the potential of the gate line GL(1080) rises to the H level via TFT 1 of the shift register 301(1080). Then, at time t12, when the potential of the clock signal CLK1 makes a transition to the H level, the dummy signal having the potential at the H level is outputted from the GL terminal of the dummy shift register 320. This causes TFT 7 of the auxiliary circuit 302(1080) to be in the ON state while the potential of the dummy signal is at the H level. To the gate line GL(1080), the potential of the clock signal CLK1 is inputted via TFT 7.

In other words, during a period from time t12 to time t13, the clock signal CLK6 has the potential at the H level, and the auxiliary potential V1 (>VSS) is inputted to the gate line GL(1080) via TFT 7 of the auxiliary circuit 320(1080). During a period from time t13 to time t14, the clock signal CLK6 has the potential at the L level, and the potential at the L level is inputted to the gate line GL(1080) via TFT 7 of the auxiliary circuit 320(1080).

In this way, by providing the dummy shift register 320, the auxiliary circuit 302 corresponding to the gate line GL of the last stage can be driven with use of the output of the GL terminal of the dummy shift register 320.

Embodiment 3

In the above-described embodiments, after the gate line GL is switched to the non-selected state, the clock signal input to the auxiliary circuit 302 also cyclically repeats potential fluctuations between the H level and the L level. When the clock signal makes a transition to the potential at the H level, therefore, leakage current of TFT 7 of the auxiliary circuit 302 flows into the gate line GL, thereby raising the potential of the gate line GL, which should be maintained in the non-selected state, in some cases. When the potential of the gate line GL, which should be maintained in the non-selected state, rises up to the selection potential, the display quality deteriorates.

As the present embodiment, a configuration of an auxiliary circuit is described that can quickly and surely switch the gate line GL to the non-selected state, and at the same time, prevent from rising of the potential of the gate line GL that should be maintained in the non-selected state.

Figure 10A:
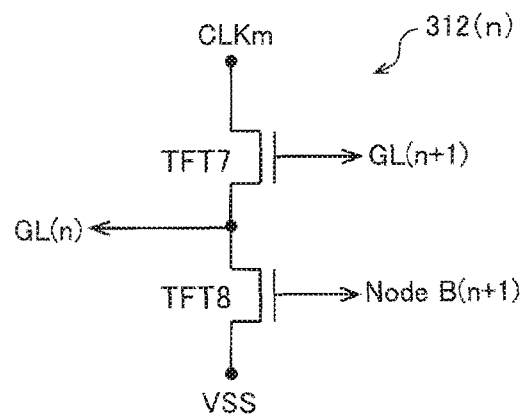
FIG. 10A is an equivalent circuit diagram of an auxiliary circuit in Embodiment 3.

FIG. 10A is an equivalent circuit diagram of an auxiliary circuit in the present embodiment. In FIG. 10A, the same configurations as those in Embodiment 1 are denoted by the same reference symbols as those in Embodiment 1. The shift register in the present embodiment has the same configuration as that of the shift register 301 (see FIG. 5) in Embodiment 1, and the illustration thereof is therefore omitted.

As shown in FIG. 10A, an auxiliary circuit 312(n) includes TFT 7 and TFT 8.

The source of TFT 7, the drain of TFT 8, and the gate line GL(n) are connected with one another. The gate of TFT 8 is connected with a node B(n+1) of the shift register 301(n+1), and the power source voltage signal VSS is inputted to the source of TFT 8.

Figure 10B:
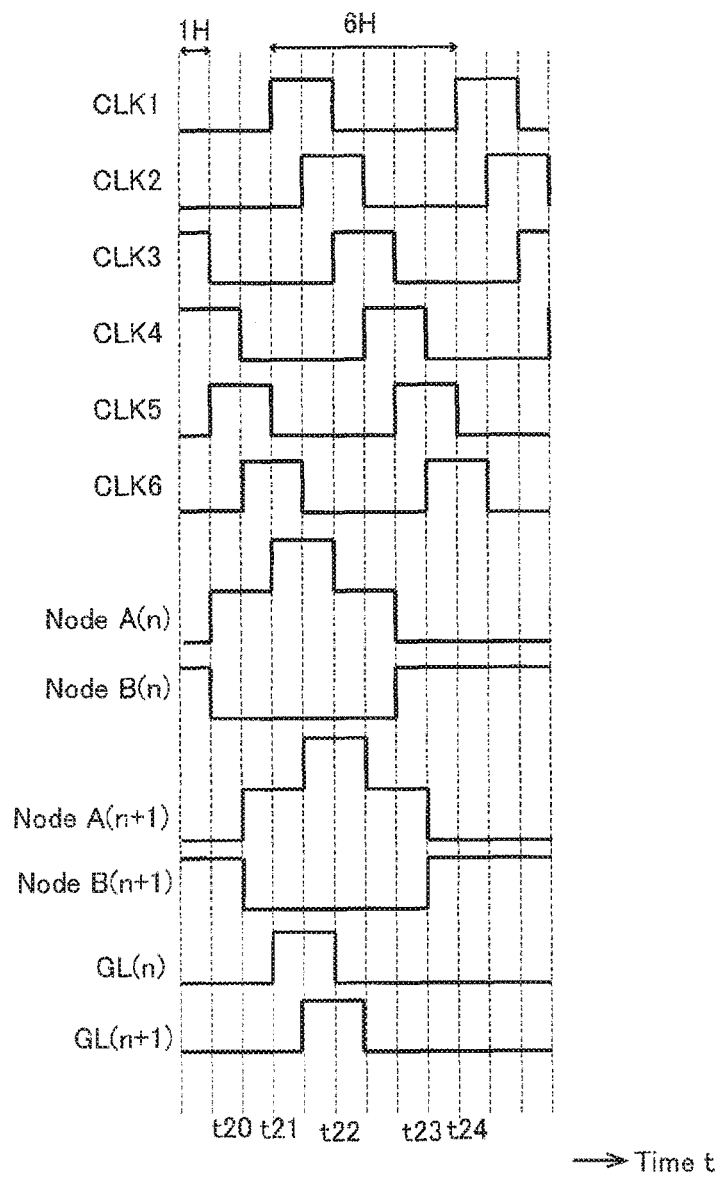
FIG. 10B is a timing chart for explaining operations of the auxiliary circuit shown in FIG. 10A.

FIG. 10B is a timing chart for describing an operation of the auxiliary circuit 312(n) in the present embodiment. Incidentally, in this example, the clock signal CLK1 is inputted to the CLKm terminals of the auxiliary circuit 312(n) and the shift register 301(n) (see FIG. 5). The operation of the shift register 301(n) is the same as that in Embodiment 1, and the following description therefore principally describes the operation of the auxiliary circuit 312(n).

As shown in FIG. 10B, during a period from time t21 to time t22, the potential of the clock signal CLK1 is at the H level, and the gate line GL(n) makes a transition to the potential at the H level via TFT 1 (see FIG. 5), whereby the gate line GL(n) becomes selected.

At time t22, the clock signal CLK1 has the potential at the L level. This causes the potential of the gate line GL(n) to fall to the L level via TFT 1 of the shift register 301(n) (see FIG. 5) and TFT 7 of the auxiliary circuit 312(n), whereby the gate line GL(n) becomes non-selected.

At time t23, the potential of the node A(n+1) of the shift register 301(n+1) makes a transition to the L level, and the potential of the node B(n+1) makes a transition to Vb1 (>VSS). This causes TFT 8 of the auxiliary circuit 312(n) to be turned ON. Here, the potential of the clock signal CLK1 is at the L level, and the gate line GL(n) maintains the potential at the L level (VSS) via TFT 7 and TFT 8.

At time t24, the potential of the clock signal CLK1 rises to the H level, but since TFT 8 is in the ON state, the gate line GL(n) maintains the potential at the L level via TFT 8.

In a case without TFT 8, when the clock signal CLK1 makes a transition to the potential at the H level (t24), leakage current of TFT 7 flows into the gate line GL(n), and the potential of the gate line GL(n) rises in some cases. In the present embodiment, TFT 8 is provided that is in the ON state at least during a period in which the gate line GL(n) is not selected, and supplies the non-selection potential to the gate line GL(n). With this configuration, any rise of the potential of the gate line GL, which should be maintained in the non-selected state, can be prevented.

Modification Example 1

With reference to FIG. 10A, an example in which the potential of the node B(n+1) is inputted to the gate of TFT 8 is described, but the potential is not limited to the potential of the node B(n+1). More specifically, a signal that has the potential at the L level during the selection period in which the gate line GL(n) is selected and has the potential at the H level during the non-selection period in which the gate line GL(n) is not selected may be inputted to the gate of TFT 8.

More specifically, for example, in the above-described example, a potential of a node B(n−1) (not shown) may be inputted to the gate of TFT 8. Though not shown in FIG. 10B, the timing at which the potential of the node B(n−1) changes is one horizontal scanning period earlier than the timing of the node B(n). In the selection period (t21 to t22)

while the gate line GL(n) is selected, therefore, the potential of the node B(n−1) is at the L level, and after time t22 when the gate line GL(n) becomes non-selected, the foregoing node has a potential at the H level. At time t24 when the clock signal CLK1 makes a transition to the potential at the H level, therefore, TFT 8 of the at auxiliary circuit 312(n) is turned ON, and the potential of the gate line GL(n) can be maintained at the L level via TFT 8.

Further, for example, the configuration may be such that a potential of any one of the clock signals CLK3 to CLK5 (see FIG. 10B) is inputted to the gate of TFT 8. As shown in FIG. 10B, the clock signals CLK3 to CLK5 have the potential at the L level during the selection period (t21 to t22) while the gate line GL(n) is selected, and have the potential at the H level after t22 when the gate line GL(n) becomes non-selected.

At time t24 when the clock signal CLK1 comes to have the potential at the H level, all of the clock signals CLK3 to CLK5 have the potential at the L level; however, since TFT 8 is cyclically turned ON during the period in which the gate line GL(n) is not selected, it is unlikely that the gate line GL(n) would make a transition to the selected state, even if the potential of the clock signal CLK1 makes a transition to the H level.

Modification Example 2

In Embodiment 3 and Modification Example 1 described above, the configuration is such that the potential of the gate line GL(n+1) is inputted to the gate of TFT 7 of the auxiliary circuit 321(n), but the configuration may be such that the potential of the node A of the shift register 301(n+1) is inputted thereto. The following description more specifically describes the configuration.

Figure 11:
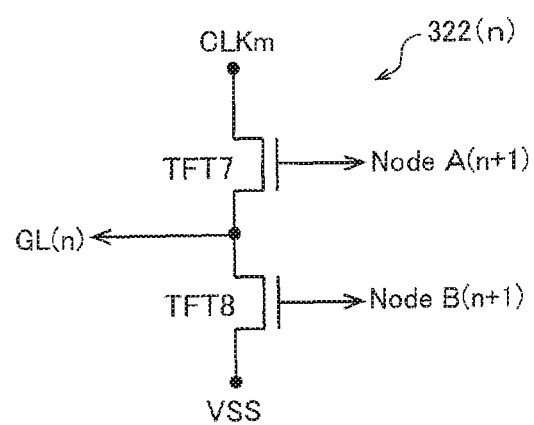
FIG. 11 is an equivalent circuit diagram of an auxiliary circuit in Modification Example 2 of Embodiment 3.

FIG. 11 is an equivalent circuit diagram of the auxiliary circuit of the modification example. In FIG. 11, the same configurations as those in Embodiment 3 are denoted by the same reference symbols as those in Embodiment 3. The following description principally describes configurations different from those in Embodiment 3.

As shown in FIG. 11, the node A(n+1) of the shift register 301(n+1) is connected to the gate of TFT 7 of the auxiliary circuit 322(n). The node B(n+1) of the shift register 301(n+1) is connected to the gate of TFT 8, as is the case with Embodiment 3.

As shown in the timing chart in FIG. 10B, the period in which the node A(n+1) has a potential higher than the L level (t20 to t23) is longer than the period in which the gate line GL(n+1) has the potential at the H level. In a case where the clock signal CLK1 is inputted to the auxiliary circuit 322(n), during a period from time t20 to time t23, the clock signal CLK1 has the potential at the H level during a period from time t21 to time t22, causing the gate line GL(n) to become non-selected.

TFT 7 is in the ON state during the six horizontal scanning periods from time t20 to time t23, whereby the auxiliary potential Vsh (VDD−Vth7) is inputted to the gate line GL(n) via TFT 7 during the selection period (t21 to t22) while the gate line GL(n) is selected. Since the potential of the clock signal CLK1 is at the L level during the period other than the period from time t21 to time t22 in the period from time t20 to time t23, the potential at the L level is inputted to the gate line GL(n) via TFT 7.

In this way, in the present modification example, TFT 7 is in the ON state, not only during the selection period in which the gate line GL(n) is selected, but also during a certain period in which the supplied clock signal has a potential at the L level, whereby the period in which TFT 7 is in the ON state is longer than that in Embodiment 3. This allows the auxiliary potential Vsh to be inputted to the gate line GL(n) via TFT 7 during the selection period in which the gate line GL(n) is selected, thereby making it possible to switch the gate line GL(n) to the selected state. Besides, when the gate line (n) is not selected, the potential at the L level is inputted to the gate line GL(n) via TFT 7, which makes it possible to cause the gate line GL(n) to quickly and surely become non-selected state.

An exemplary display device according to the present invention is described above, but the configuration of the display device according to the present invention is not limited to the configurations of the above-described embodiments; the display device according to the present invention may have any one of a variety of modified configurations. The following description describes the modification examples.

(1) In the above-described embodiments, the lines 70 for supplying the clock signals to the auxiliary circuits 302, 312, and 322 may have a width smaller than the width of the line 70 for supplying the clock signal to the shift register 301. In other words, among the lines 70 for supplying the clock signals CLK1 to CLK6, which are arranged in the frame region on the left side of the display area D in FIG. 4, the lines 70 for the clock signals CLK2, CLK4, and CLK6 supplied to the auxiliary circuits 302 corresponding to the even-number-th gate lines GL may have a width smaller than the width of the lines 70 for the clock signals CLK1, CLK3, and CLK5. Likewise, among the lines 70 for supplying the clock signals CLK1 to CLK6, which are arranged in the frame region on the right side of the display area D, the lines 70 for the clock signals CLK1, CLK3, and CLK5 supplied to the auxiliary circuits 302 corresponding to the odd-number-th gate lines GL may have a width smaller than the width of the lines 70 for the clock signals CLK2, CLK4, and CLK6.

The auxiliary circuit helps to make the state of the gate line GL change to the non-selected state. For this reason, even if the resistance of the line for the clock signal to be supplied to the auxiliary circuit is higher than the resistance of the line for the clock signal to be supplied to the shift register 301, influences of the same to the scanning of the gate line GL are small. This configuration therefore makes it possible to reduce the size of the frame regions on the right and left sides of the display area.

(2) Further, in the above-described embodiments, the channel width of TFTs that compose the auxiliary circuits 302, 312, 322 may be smaller than that of TFTs that compose the shift register 301. As described above, the auxiliary circuit helps to make the state of the gate line GL change to the non-selected state. The drive capability of this auxiliary circuit does not have to be as high as the drive capability of the shift register, and such a configuration makes it possible to reduce the frame regions on the right and left of the display area.

(3) Embodiments 1 to 3 described above are described with reference to an exemplary case where the six-phase clock signals are supplied to the shift registers and the auxiliary circuits, but four or more-phase clock signals may be supplied. The following description describes the configuration of a shift register in a case where four-phase clock signals are supplied thereto.

Figure 12A:
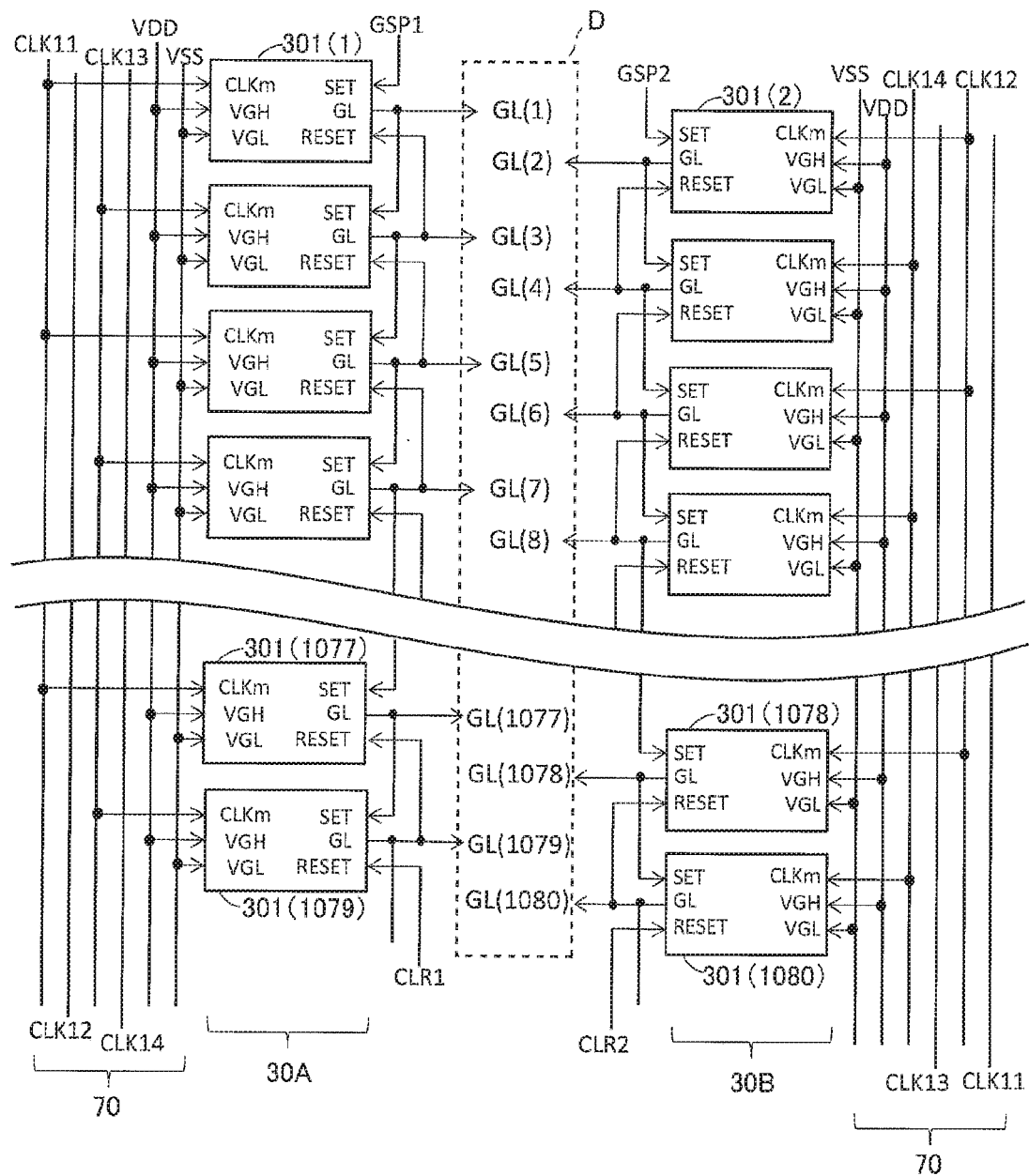
FIG. 12A schematically shows control signals and the connection relationship of shift registers in Modification Example (3).
Figure 12B:
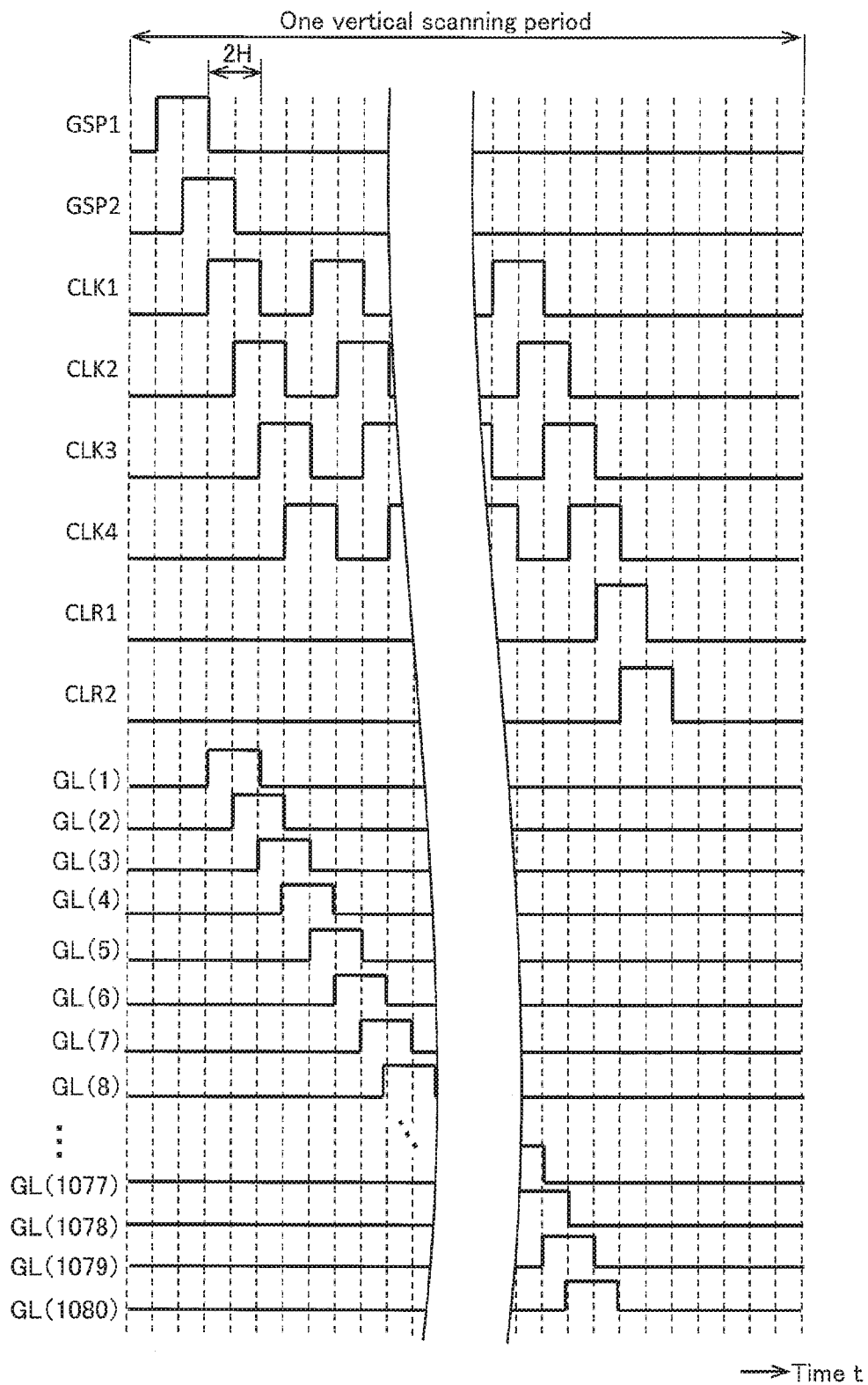
FIG. 12B is a timing chart illustrating potential changes in the gate lines and control signals in Modification Example (3).

FIG. 12A schematically shows control signals supplied to the shift registers 301 and the connection relationship of the shift registers 301 in the present modification example. Further, FIG. 12B is a timing chart illustrating potential changes in the gate lines GL and control signals during one vertical scanning period. In FIG. 12A, the same configurations as those in Embodiment 1 (FIG. 4) are denoted by the same reference symbols as those in Embodiment 1. Though the illustration is omitted in FIG. 12A, auxiliary circuits 302 are arranged so as to correspond to the gate lines GL in the frame regions on the right and left sides of the display area D, as is the case with Embodiment 1. The following description principally describes configurations different from those in Embodiment 1.

As shown in FIG. 12A, one clock signal of four-phase clock signals CLK11 to CLK14 that have phases different from one another is inputted to the CLKm terminal of the shift register 301. The potential of each of the clock signals CLK11 to CLK14 changes between the H level and the L level every two horizontal scanning periods, as shown in FIG. 12B.

Further, as shown in FIG. 12A, the RESET terminal of the shift register 301(1) is connected with the gate line GL(3), the RESET terminal of the shift register 301(2) is connected with the gate line GL(4). In other words, in this example, the RESET terminal of the shift register 301(n) is connected with the gate line GL(n+2), which is two rows ahead with respect to the gate line GL(n) corresponding thereto. Further, in this example, the signal CLR1 and the signal CLR2 are inputted, as reset signals, to the RESET terminals of the shift register 301(1079) and the shift register 301(1080), respectively.

Each gate line GL has a pre-charging period and a main charging period as selection periods in each horizontal scanning period. The clock signals may be supplied so that the selection periods while the adjacent gate lines GL are selected, respectively, may overlap with each other during at least one horizontal scanning period in this way.

(4) The above-described embodiments are described with reference to an example in which each TFT used in the driving circuits is formed with an n-channel TFT, but TFT may be formed with a p-channel TFT, or alternatively, the n-channel TFTs and the p-channel TFTs may be present together. In the case of the p-channel TFT, as the voltage applied to the gate electrode is low, electric current flows more easily between the drain and the source. In the case where p-channel TFTs are used, therefore, the potential relationship in each embodiment is inverse to the potential relationship in the case of the n-channel TFT.

(5) In the above-described embodiments, amorphous silicon (a-Si) may be used in the semiconductor layers of TFTs in the pixel switching elements 11 as well as the shift registers 301 and the auxiliary circuit 302; however, oxide semiconductor is preferably used therein.

Examples of the oxide semiconductor include a ternary oxide of In(indium)-Ga(gallium)-Zn(zinc)-O(oxygen). The ratio (composition ratio) of In, Ga and Zn is not limited particularly; it may be, for example, In:Ga:Zn=2:2:1, In:Ga:Zn=1:1:1, In:Ga:Zn=1:1:2, or the like. Alternatively, for example, the oxide semiconductor may contain In, Ga, and Zn at a ratio of 1:1:1. A TFT having an In—Ga—Zn—O-based semiconductor layer has a higher mobility (20 times or more) than that of the TFT in which a-Si is used, and has smaller leakage current (1/100 or less) than that of the TFT in which a-Si is used. For this reason, such a TFT is suitably used as a TFT in the shift register 301. In a case where TFTs having an In—Ga—Zn—O-based semiconductor layer are used, leakage current of the shift registers 301 is suppressed, whereby electric power consumption of the display device can be drastically reduced.

Further, the In—Ga—Zn—O-based semiconductor may be amorphous, or alternatively, it may include crystalline substance parts, thereby having crystallinity. As the crystalline In—Ga—Zn—O-based semiconductor, a crystalline In—Ga—Zn—O-based semiconductor in which the c-axis is aligned so as to be approximately vertical to the layer surface is preferable. The crystal structure of such an In—Ga—Zn—O-based semiconductor is disclosed in, for example, JP-A-2012-134475, the entirety of which is incorporated herein by reference.

The oxide semiconductor layer may contain another oxide semiconductor in place of the In—Ga—Zn—O-based semiconductor. The oxide semiconductor layer may contain, for example, Zn—O-based semiconductor (ZnO), In—Zn—O-based semiconductor (IZO (registered trademark)), Zn—Ti—O-based semiconductor (ZTO), Cd—Ge—O-based semiconductor, Cd—Pb—O-based semiconductor, CdO (cadmium oxide), Mg—Zn—O-based semiconductor, In—Sn—Zn—O-based semiconductor (for example, $In_2O_3$—$SnO_2$—ZnO), In—Ga—Sn—O-based semiconductor, or the like.

(6) The above-described embodiments are described with reference to an exemplary display device in which liquid crystal is used, but shift registers and auxiliary circuits of each embodiment may be applied to a display device in which organic electroluminescence (organic EL) is used.

The invention claimed is:

1. A display device comprising:
a display panel having a plurality of gate lines;
a plurality of driving circuits that are provided so as to correspond to the gate lines, respectively, the driving circuits sequentially switching the gate lines to a selected state so as to scan the gate lines sequentially;
a plurality of auxiliary circuits that are provided so as to correspond to the gate lines, respectively, the auxiliary circuits being connected with the corresponding gate lines, respectively; and
a control circuit that supplies control signals that include M-phase driving signals (M is a natural number of 4 or greater), to the driving circuits and the auxiliary circuits,
wherein each of the M-phase driving signals makes a transition in a predetermined cycle between a first potential level corresponding to a gate line selected state, and a second potential level corresponding to a gate line non-selected state,
to each of the driving circuits and the auxiliary circuits, one driving signal of the M-phase driving signals is supplied,
each of the driving circuits outputs a potential of the supplied one driving signal to the gate line as a scanning object so as to switch the gate line as a scanning object to the selected state or the non-selected state,
a selection period in which the gate line is in the selected state includes a pre-charging period and a main charging period, the main charging period for one of adjacent two of the gate lines and the pre-charging period for the other one of the adjacent two of the gate lines overlapping with each other, and
each of the auxiliary circuits is driven at least during the main charging period for the gate line corresponding to the said auxiliary circuit, and during the main charging period for the gate line of the next stage with respect to the corresponding gate line, outputs a potential at the first potential level of the supplied one driving signal during the main charging period for the corresponding gate line, and outputs a potential at the second potential level of the supplied one driving signal during the main charging period for the gate line of the next stage.

2. The display device according to claim 1,
wherein each of the auxiliary circuits includes a discharge switching element,
each of the discharge switching elements of the auxiliary circuits corresponding to the gate lines other than the gate line of the last stage, among the auxiliary circuits, has a gate electrode connected with the gate line of the next stage, and
the discharge switching element of the auxiliary circuit corresponding to the gate line of the last stage has a gate electrode that is kept at the first potential level during the main charging period for the gate line of the last stage, and during a certain period after the main charging period ends.

3. The display device according to claim 2,
wherein the control signal includes a reset signal that is at the first potential level during the main charging period for the gate line of the last stage, and during a certain period after the said main charging period ends, and is at the second potential level during the other period, and
the reset signal is supplied to the gate electrode of the discharge switching element of the auxiliary circuit corresponding the gate line of the last stage.

4. The display device according to claim 2, further comprising:
a dummy driving circuit to which one driving signal among the M-phase driving signals is supplied, which is driven during the main charging period for the gate line of the last stage, and during one horizontal scanning period after the said main charging period ends, based on the one driving signal, and which outputs the potential at the first potential level of the one driving signal, to the gate electrode of the discharge switching element of the auxiliary circuit corresponding the gate line of the last stage.

5. The display device according to claim 2,
wherein the auxiliary circuit further includes a stabilization switching element,
wherein the stabilization switching element has:
a drain electrode that is connected with the gate line corresponding to the said auxiliary circuit; and
a source electrode that has the potential at the second potential level, and
the stabilization switching element is not driven during the selection period in which the gate line corresponding to the stabilization switching element is selected, is driven at least during a part of the period in which the corresponding gate line is in the non-selected state, and supplies the potential at the second potential level to the corresponding gate line.

6. The display device according to claim 5,
wherein each of the driving circuits includes an output switching element that outputs the potential of the supplied one driving signal to the gate line corresponding thereto, a first internal line that is connected to the gate of the output switching element, and a second internal line that has a potential opposite to a potential of the first internal line,
the first internal line of each driving circuit has a potential equal to or greater than a threshold voltage of the output switching element when the gate line as the scanning object of the driving circuit is in the selected state, and
the stabilization switching element has a gate electrode that is connected with the second internal line in the driving circuit corresponding to the gate line of the next stage with respect to the gate line as the scanning object.

7. The display device according to claim 6,
wherein the gate electrode of the discharge switching element is connected with the first internal line in the driving circuit corresponding to the gate line of the next stage.

8. The display device according o claim 1,
the driving circuits include a plurality of first driving circuits for scanning odd-number-th ones of the gate lines as scanning objects, and a plurality of second driving circuits for scanning even-number-th ones of the gate lines as scanning objects,
the auxiliary circuits include a plurality of first auxiliary circuits that are provided so as to correspond to the first driving circuits, respectively, and a plurality of second auxiliary circuits that are provided so as to correspond to the first driving circuits, respectively, and
the first driving circuits and the second auxiliary circuits are provided outside the display area, on one end side of the gate lines, and the second driving circuits and the first auxiliary circuits are provided outside the display area, on the other end side of the gate lines.

9. The display device according to claim 1, further comprising:
a plurality of lines for the driving circuits, the lines being for supplying the M-phase driving signals to the driving circuits; and
a plurality of lines for the auxiliary circuits, the lines being for supplying the M-phase driving signals to the auxiliary circuits,
wherein the lines for the auxiliary circuits have a width smaller than a width of the lines for the driving circuits.

10. The display device according to claim 1,
wherein each of the driving circuits includes a plurality of switching elements,
each of the auxiliary circuits includes a discharge switching element that outputs a potential at the second potential level of the supplied one driving signal to the gate line corresponding thereto, and
the discharge switching element has a channel width that is smaller than a channel width of the switching element of each of the driving circuits.

* * * * *